(12) United States Patent
Onoue

(10) Patent No.: US 7,797,960 B2
(45) Date of Patent: Sep. 21, 2010

(54) TEMPERATURE CONTROL APPARATUS

(75) Inventor: Katsuhiko Onoue, Hamamatsu (JP)

(73) Assignee: Yamaha Corporation, Shizuoka-Ken (JP)

(*) Notice: Subject to any disclaimer, the term of this patent is extended or adjusted under 35 U.S.C. 154(b) by 390 days.

(21) Appl. No.: 11/620,985

(22) Filed: Jan. 8, 2007

(65) Prior Publication Data

US 2007/0157628 A1 Jul. 12, 2007

(30) Foreign Application Priority Data

Jan. 11, 2006 (JP) ............................. 2006-003722
Nov. 10, 2006 (JP) ............................. 2006-304946

(51) Int. Cl.
*F25D 23/12* (2006.01)
(52) U.S. Cl. ........................................ 62/259.2; 62/3.2
(58) Field of Classification Search .................... 62/3.2, 62/3.7, 259.2; 361/697, 702, 703
See application file for complete search history.

(56) References Cited

U.S. PATENT DOCUMENTS 6,230,497 B1 * 5/2001 Morris et al. ................. 62/3.7

FOREIGN PATENT DOCUMENTS

| JP | 10-326914 A | 12/1998 |
|---|---|---|
| JP | 2004-279340 A | 10/2004 |
| JP | 2005-183676 | 7/2005 |
| JP | 2005-303183 | 10/2005 |
| JP | 2005-334804 A | 12/2005 |

* cited by examiner

Primary Examiner—Melvin Jones
(74) Attorney, Agent, or Firm—Dickstein Shapiro LLP

(57) ABSTRACT

A temperature control apparatus for controlling the temperature of at least a temperature controlled portion of a microchip is provided. The temperature control apparatus includes a heat sink, a temperature control unit, and a surrounding unit. The temperature control unit is disposed adjacent to the heat sink. The temperature control unit includes at least one Peltier-type temperature control device that is configured to control the temperature of at least a temperature controlled portion of a microchip. The surrounding unit is disposed on the heat sink. The surrounding unit is configured to surround the at least one Peltier-type temperature control device. The surrounding unit is configured to define a closed-space together with the heat sink and the microchip. The closed-space contains the at least one Peltier-type temperature control device.

20 Claims, 16 Drawing Sheets

TEMPERATURE CONTROL APPARATUS

BACKGROUND OF THE INVENTION

1. Field of the Invention

The present invention generally relates to a temperature control apparatus. More specifically, the present invention relates to a temperature control apparatus configured to control a temperature controlled portion of a microchip. The temperature controlled portion is subject to a temperature control by the temperature control apparatus.

Priority is claimed on Japanese Patent Applications No. 2006-3722, filed Jan. 11, 2006, and No. 2006-304946, filed Nov. 10, 2006, the contents of which are incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

A temperature control apparatus has been known as being configured to control the temperature of a predetermined temperature controlled portion of a microchip that includes a microreactor and a flow-path. The temperature control apparatus includes a temperature controlling portion that is configured to control the temperature of the temperature controlled portion. The temperature controlling portion may be a Peltier type temperature controlling portion including a Peltier module. The temperature controlling portion is configured to heat and cool the temperature controlled portion so as to control or adjust the temperature controlled portion at a predetermined temperature.

If the Peltier type temperature controlling portion including the Peltier module is used, the temperature of the temperature controlled portion can be dropped to a lower temperature than room temperature. If the temperature of the temperature controlled portion becomes lower than a dew point of atmosphere, a moisture in the atmosphere around the temperature controlled portion is condensed to form water droplets on the exposed surface of the temperature controlled portion. The moisture condensation on the exposed surface of the temperature controlled portion may cause corrosion or form short circuit of the temperature controlling portion or the Peltier module. First and second conventional techniques have been proposed for providing moisture proof around the Peltier module of the temperature controlled portion.

Japanese Unexamined Patent Application, First Publication, No. 2005-303183 discloses the first conventional technique for providing moisture proof around the Peltier module. An epoxy resin is provided around the Peltier module. Namely, the epoxy resin is filled into a gap around the Peltier module. The epoxy resin provides a moisture proof.

Japanese Unexamined Patent Application, First Publication, No. 2005-183676 discloses the second conventional technique for providing moisture proof around the Peltier module. An O-ring is provided around the Peltier module. The O-ring is sandwiched between two plates to provide a moisture proof.

In accordance with the first conventional technique, the epoxy resin around the Peltier module performs as a barrier against moisture liquid or water drops, but permits infiltration or penetration of moisture vapor into the Peltier module. The epoxy resin exhibits a time-dependent degradation on the moisture proof performance. The moisture proof performance of the epoxy resin is unstable for a long time period.

In accordance with the second conventional technique, the O-ring is sandwiched between the two plates. The two plates are mechanically connected to each other via screws. The O-ring and the screws permit heat transmissions through them, thereby decreasing a cooling efficiency of the Peltier module, while increasing power consumption of the temperature controlling portion. The two plates sandwiching the O-ring makes it difficult to reduce the dimensions or size of the temperature controlling portion. This makes is difficult to apply the temperature control apparatus to control the temperature of a small temperature controlled portion of the microchip.

In view of the above, it will be apparent to those skilled in the art from this disclosure that there exists a need for an improved temperature control apparatus. This invention addresses this need in the art as well as other needs, which will become apparent to those skilled in the art from this disclosure.

SUMMARY OF THE INVENTION

Accordingly, it is a primary object of the present invention to provide a temperature control apparatus.

It is another object of the present invention to provide a temperature control apparatus that is suitable for controlling the temperature of a small temperature controlled portion.

It is a further object of the present invention to provide a temperature control apparatus includes a temperature controlling portion that is free from dew.

In accordance with a primary aspect of the present invention, a temperature control apparatus for controlling the temperature of at least a temperature controlled portion of a microchip is provided. The temperature control apparatus may include, but is not limited to, a heat sink, a temperature control unit, and a surrounding unit. The temperature control unit may be disposed adjacent to the heat sink. The temperature control unit may include at least one Peltier-type temperature control device that is configured to control the temperature of at least a temperature controlled portion of a microchip. The surrounding unit may be disposed on the heat sink. The surrounding unit may be configured to surround the at least one Peltier-type temperature control device. The surrounding unit may be configured to define a closed-space together with the heat sink and the microchip. The closed-space contains the at least one Peltier-type temperature control device.

BRIEF DESCRIPTION OF THE DRAWINGS

Referring now to the attached drawings which form a part of this original disclosure.

DETAILED DESCRIPTION OF THE INVENTION

Figure 1:
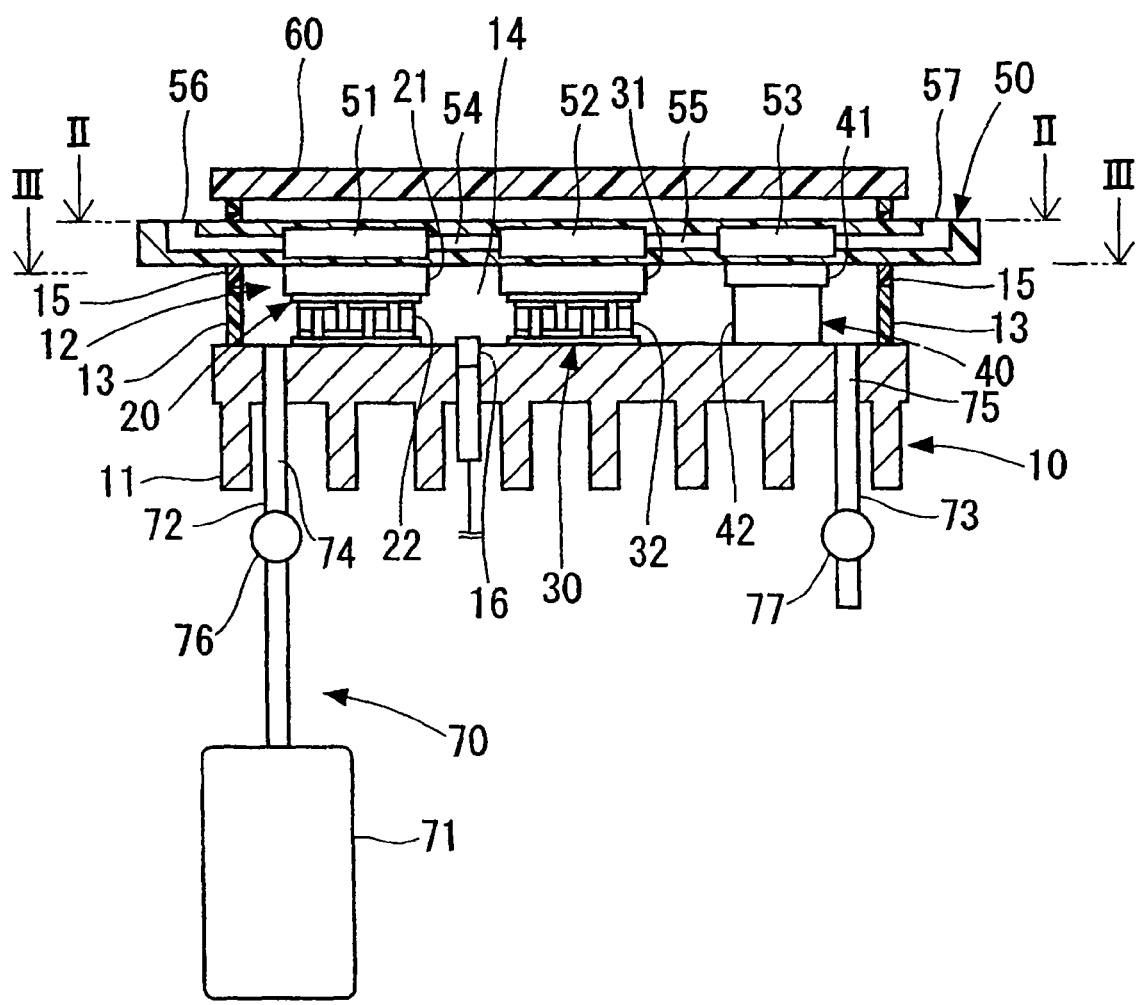
FIG. 1 is a cross sectional elevation view illustrating a temperature control apparatus on which a microchip is mounded in accordance with a first embodiment of the present invention.

In general, a temperature control apparatus for controlling the temperature of at least a temperature controlled portion of a microchip is provided. The temperature control apparatus may include, but is not limited to, a heat sink, a temperature control unit, and a surrounding unit. The temperature control unit may be disposed adjacent to the heat sink. The temperature control unit may include at least one Peltier-type temperature control device that is configured to control the temperature of at least a temperature controlled portion of a microchip. The surrounding unit may be disposed on the heat sink. The surrounding unit may be configured to surround the at least one Peltier-type temperature control device. The surrounding unit may be configured to define a closed-space together with the heat sink and the microchip. The closed-space contains the at least one Peltier-type temperature control device.

In the last-mentioned case, the closed-space is defined by the surrounding unit, the heat sink and the microchip that is mounted on the temperature control apparatus. In other words, the surrounding unit is configured to define or form the closed-space together with the heat sink and the microchip. The at least one Peltier-type temperature control device is disposed in the closed-space. The surrounding unit is configured to prevent an outside air from flowing into the closed-space while the microchip is mounted on the temperature control apparatus. In other words, the surrounding unit is configured to confine the gas in the closed-space and isolate the gas from the outside air, while the microchip is mounted on the temperature control apparatus. The amount of moisture is limitative, which is contained in the gas confined in the closed-space. Thus, the moisture condensation is also limitative, which appears on an exposed surface of the at least one Peltier-type temperature control device. This configuration to limit the moisture condensation may contribute to prevent the at least one Peltier-type temperature control device from being broken.

Further, the surrounding unit may be configured to surround the temperature control unit, thereby limiting a size or volume of the temperature control unit. The temperature control unit having the limited size or volume is suitable to control at least a size-limited temperature controlled portion of the microchip.

The temperature controlled portion of the microchip may be, but is not limited to, a reactor of the microchip.

The surrounding unit may be realized by, but not limited to, a frame alone or in combination with one or more sealing members.

In some cases, the surrounding unit may include, but is not limited to, a frame that is attached to the heat sink. The frame may be configured to support the microchip and allow the microchip to be removably mounted on the temperature control apparatus. The frame may have first and second sides opposing each other. The first side of the frame is adjacent to the heat sink. The second side of the frame is adjacent to the microchip that is mounted on the temperature control apparatus. The surrounding unit may allow that mounting the microchip on the temperature control apparatus form the closed-space which is defined by the surrounding unit, the heat sink and the microchip. It is easy to form the closed-space by mounting the microchip on the temperature control apparatus.

The surrounding unit may further include a sealing member that is disposed between the frame and the microchip. The sealing member may be configured to seal the closed-space. The sealing member may be flexible and heat-insulative.

The closed-space is sealed with the sealing member. Thus, the sealing member may be configured to prevent the outside air from flowing into the closed-space while the microchip is mounted on the temperature control apparatus. In other words, the sealing member may be configured to confine the gas in the closed-space and isolate the gas from the outside air, while the microchip is mounted on the temperature control apparatus. The amount of moisture is limitative, which is contained in the gas confined in the closed-space. Thus, the moisture condensation is also limitative, which appears on an exposed surface of the at least one Peltier-type temperature control device. This configuration to limit the moisture condensation may contribute to prevent the at least one Peltier-type temperature control device from being broken.

The sealing member is deformable by mounting the microchip on the temperature control apparatus. The deformability of the sealing member may improve the sealability of the closed-space. The deformability of the sealing member may also allow the temperature control unit to be in contact tightly with the microchip.

The sealing member may be heat insulative. In other words, the sealing member may be made of a material having a low heat conductivity. The sealing member may prevent heat transfer between the surrounding unit or the frame and the microchip. This heat insulative structure may reduce a power consumption of the at least one Peltier-type temperature control device.

In some cases, the surrounding unit may include a frame that is attached to the microchip. The frame may have first and second sides opposing each other. The first side of the frame is adjacent to the heat sink. The second side of the frame is in contact with or is united with the microchip. The surrounding unit may allow that mounting the microchip on the temperature control apparatus form the closed-space which is defined by the surrounding unit, the heat sink and the microchip. It is easy to form the closed-space by mounting the microchip on the temperature control apparatus.

The surrounding unit may further include a sealing member disposed between the frame and the heat sink. The sealing member may be configured to seal the closed-space. The sealing member may be flexible and heat-insulative.

The closed-space is sealed with the sealing member. Thus, the sealing member may be configured to prevent the outside air from flowing into the closed-space while the microchip is mounted on the temperature control apparatus. In other words, the sealing member may be configured to confine the gas in the closed-space and isolate the gas from the outside air, while the microchip is mounted on the temperature control apparatus. The amount of moisture is limitative, which is contained in the gas confined in the closed-space. Thus, the moisture condensation is also limitative, which appears on an exposed surface of the at least one Peltier-type temperature control device. This configuration to limit the moisture condensation may contribute to prevent the at least one Peltier-type temperature control device from being broken.

The sealing member is deformable by mounting the microchip on the temperature control apparatus. The deformability of the sealing member may improve the sealability of the closed-space. The deformability of the sealing member may also allow the temperature control unit to be in contact tightly with the microchip.

The sealing member may be heat insulative. In other words, the sealing member may be made of a material having a low heat conductivity. The sealing member may prevent heat transfer between the surrounding unit or the frame and the heat sink. This heat insulative structure may reduce a power consumption of the at least one Peltier-type temperature control device.

In some cases, the temperature control apparatus may further include a filler that is disposed in the closed-space and between the at least one Peltier-type temperature control device and the surrounding unit. The presence of the filler reduces the volume of the closed-space. The reduction in the volume of the closed-space reduces the amount of a gas confined in the closed-space. The reduction in the amount of the gas reduces the amount of moisture contained in the gas confined in the closed-space. The reduction of the amount of moisture may reduce the moisture condensation which appears on the exposed surface of the at least one Peltier-type temperature control device. This configuration to reduce the moisture condensation may contribute to prevent the at least one Peltier-type temperature control device from being broken.

In some cases, the temperature control apparatus may further include a dehumidifier that is configured to reduce a humidity of the closed-space. The reduction in the humidity of the closed-space reduces the amount of moisture contained in the gas confined in the closed-space. The reduction of the amount of moisture may reduce the moisture condensation which appears on the exposed surface of the at least one Peltier-type temperature control device. This configuration to reduce the moisture condensation may contribute to prevent the at least one Peltier-type temperature control device from being broken.

The dehumidifier may be configured to reduce the humidity of the closed-space at a predetermined humidity level at which a dew point of a gas confined in the closed-space is lower than a lower limit of a controllable temperature range of the at least one Peltier-type temperature control device. This configuration prevents a moisture condensation from appearing on the exposed surface of the at least one Peltier-type temperature control device, thereby preventing the at least one Peltier-type temperature control device from being broken.

After the microchip has been replaced, the closed space is filled with an atmosphere which has the same moisture level as the outside atmosphere. The dehumidifier will work to reduce the humidity of the atmosphere confined in the closed-space before the temperature control is performed by the at least one Peltier-type temperature control device in the dehumidified gas that is confined in the closed-space. This configuration prevents a moisture condensation from appearing on the exposed surface of the at least one Peltier-type temperature control device, thereby preventing the at least one Peltier-type temperature control device from being broken.

In some cases, the dehumidifier may be configured to supply a dehumidified gas to the closed-space. The dehumidified gas may be a dry gas. The closed-space is filled with the dehumidified gas or the dry gas, while the temperature control is performed by the at least one Peltier-type temperature control device. This configuration prevents a moisture condensation from appearing on the exposed surface of the at least one Peltier-type temperature control device, thereby preventing the at least one Peltier-type temperature control device from being broken.

In some cases, the dehumidifier may be configured to depressurize the closed-space so that the dehumidified gas or the dry gas is vacuumed into the depressurized closed-space, thereby quickly filling the closed-space with the dehumidified gas or the dry gas.

In some cases, the dehumidifier may include, but is not limited to, a gas circulation system and a first cooling unit.

The gas circulation system may include a gas circulation passage that extends to the outside of the closed-space and communicates with the closed-space. The gas circulation system is configured to circulate a gas in the closed-space through the gas circulation passage. The first cooling unit may be disposed on the gas circulation passage. The first cooling unit may be configured to cool the gas flowing through the gas circulation passage and to cause a moisture condensation, thereby producing a dehumidified gas. The dehumidified gas is supplied to the closed-space. In other words, the closed-space is filled with the dehumidified gas. This configuration prevents a moisture condensation from appearing on the exposed surface of the at least one Peltier-type temperature control device, thereby preventing the at least one Peltier-type temperature control device from being broken.

In the last-mentioned case, the dehumidifier may further include a gas supplying unit that is disposed on the gas circulation passage downstream of the first cooling unit. The gas supplying unit is configured to contain the dehumidified gas and supply the dehumidified gas to the closed-space. This configuration prevents a moisture condensation from appearing on the exposed surface of the at least one Peltier-type temperature control device, thereby preventing the at least one Peltier-type temperature control device from being broken.

In some cases, the dehumidifier may include, but is not limited to, an endothermic reacting portion configured to be exposed to the closed-space, and a second cooling unit that is configured to cool the endothermic reacting portion at a lower temperature than that of the temperature control unit. The endothermic reacting portion is cooled at the lower temperature than that of the temperature control unit, thereby causing a moisture condensation on an exposed surface of the endothermic reacting portion, while reducing the humidity of the closed-space. This configuration allows the at least one Peltier-type temperature control device to perform the temperature control process in the dehumidified gas that is confined in the closed-space. This configuration prevents a moisture condensation from appearing on the exposed surface of the at least one Peltier-type temperature control device, thereby preventing the at least one Peltier-type temperature control device from being broken.

In some cases, the dehumidifier may include, but is not limited to, a gas circulation system and a moisture absorber. The gas circulation system may include a gas circulation passage that extends to the outside of the closed-space and communicates with the closed-space. The gas circulation system is configured to circulate a gas in the closed-space through the gas circulation passage. The moisture absorber is disposed on the gas circulation passage. The moisture absorber is configured to absorb moisture that is contained in the gas flowing through the gas circulation passage, thereby producing a dehumidified gas. The dehumidified gas is supplied to the closed-space. In other words, the closed-space is filled with the dehumidified gas. This configuration prevents a moisture condensation from appearing on the exposed surface of the at least one Peltier-type temperature control device, thereby preventing the at least one Peltier-type temperature control device from being broken.

In the lest-mentioned case, the dehumidifier may further include a gas supplying unit that is disposed on the gas circulation passage downstream of the moisture absorber. The gas supplying unit is configured to contain the dehumidified gas and supply the dehumidified gas to the closed-space. The closed-space is filled with the dehumidified gas. This configuration prevents a moisture condensation from appearing on the exposed surface of the at least one Peltier-type temperature control device, thereby preventing the at least one Peltier-type temperature control device from being broken.

In some cases, the temperature control apparatus may further include, but is not limited to, a depressurizing unit that is configured to depressurize the closed-space. The depressurization of the closed-space reduces the amount of a gas that is confined in the closed-space. The reduction in the amount of the confined gas reduces the amount of moisture that is contained in the gas that is confined in the closed-space. In other words, the reduction in the amount of the confined gas reduces the humidity of the closed-space. The reduction of the moisture amount or the reduction of the humidity may prevent a moisture condensation from appearing on the exposed surface of the at least one Peltier-type temperature control device, thereby preventing the at least one Peltier-type temperature control device from being broken.

The depressurization of the closed-space causes an atmospheric pressure to be applied to the microchip toward the heat sink so that the microchip may be in contact tightly with the temperature control unit. The tight contact between the microchip and the temperature control unit may allow the temperature control unit to perform a highly accurate temperature control of the microchip.

In some cases, the temperature control apparatus may further include a cold dehumidifier that is disposed adjacent to the heat sink and in the closed-space. The cold dehumidifier is configured to be controlled to have a lower temperature than that of the temperature control unit so as to cause a moisture condensation on an exposed surface of the cold dehumidifier, while reducing the humidity of the closed-space. This configuration allows the at least one Peltier-type temperature control device to perform the temperature control process in the dehumidified gas that is confined in the closed-space. This configuration prevents a moisture condensation from appearing on the exposed surface of the at least one Peltier-type temperature control device, thereby preventing the at least one Peltier-type temperature control device from being broken.

In the last-mentioned case, the cold dehumidifier may be configured to be removable from the heat sink. The cold dehumidifier may include at least one different Peltier-type temperature control device than the at least one Peltier-type temperature control device included in the temperature control unit. The cold dehumidifier is operated to have the lower temperature to cause the moisture condensation on the exposed surface thereof. Thus, the moisture condensation may cause the cold dehumidifier to be broken. The removable cold dehumidifier may be replaced easily.

Typically, the surrounding unit may be configured to support the microchip and allow the microchip to be removably mounted on the temperature control apparatus.

In some cases, the dehumidifier may be configured to reduce the humidity at a predetermined humidity level at which a dew point of a gas confined in the closed-space is lower than a lower limit of a controllable temperature range of the at least one Peltier-type temperature control device. This configuration prevents a moisture condensation from appearing on the exposed surface of the at least one Peltier-type temperature control device, thereby preventing the at least one Peltier-type temperature control device from being broken.

Selected embodiments of the present invention will now be described with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Figure 2:
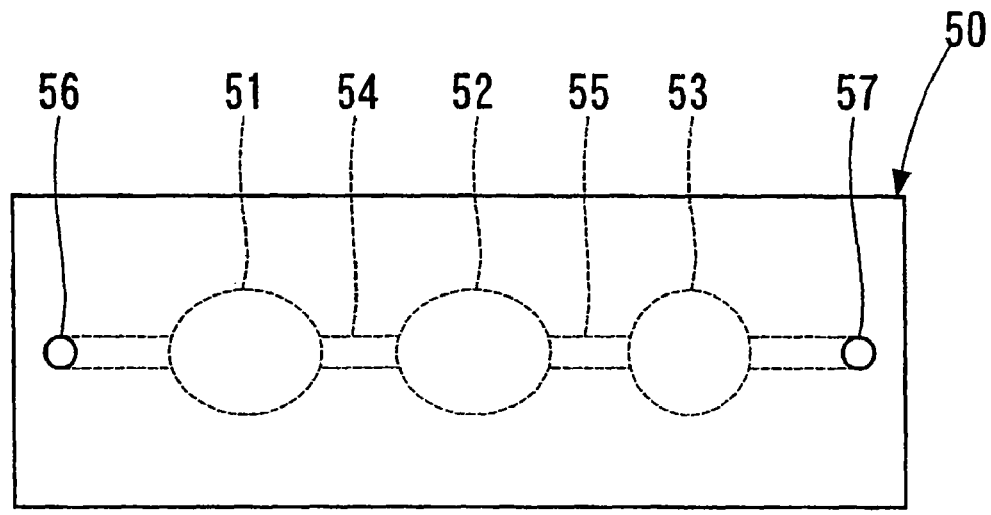
FIG. 2 is a cross sectional horizontal view illustrating the microchip, taken along a II-II line of FIG. 1.
Figure 3:
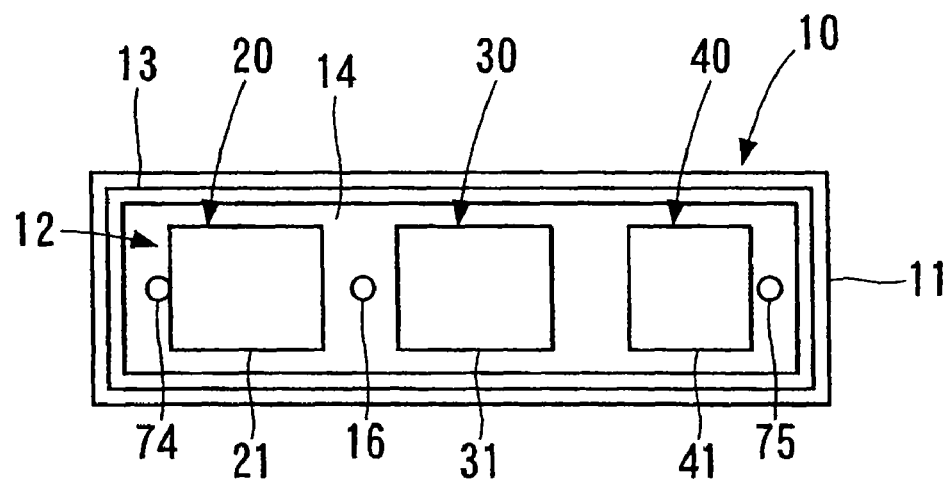
FIG. 3 is a cross sectional horizontal view illustrating the temperature control apparatus, taken along a III-III line of FIG. 1.

FIG. 1 is a cross sectional elevation view illustrating a temperature control apparatus on which a microchip is mounded in accordance with a first embodiment of the present invention. FIG. 2 is a cross sectional horizontal view illustrating the microchip, taken along a II-II line of FIG. 1. FIG. 3 is a cross sectional horizontal view illustrating the temperature control apparatus, taken along a III-III line of FIG. 1.

A temperature control apparatus 10 is configured to allow a microchip 50 to be removably mounted thereon. The temperature control apparatus 10 may include, but is not limited to, a heat sink 11, a temperature control unit 12, and a frame 13.

The microchip 50 may have an optional shape. The microchip 50 may be made of an optional material. Typical examples of the optional material for the microchip 50 may include, but are not limited to, glasses, silicon, ceramics, metals, plastic materials, rubbers such as silicone rubbers, and composite materials thereof. The microchip 50 may be formed of a single part or a plurality of parts. For example, the microchip 50 may be formed of a substrate and a cover. The microchip 50 has first and second surfaces opposing each other.

The microchip 50 may include, but is not limited to, first, second and third reactors 51, 52, and 53, first and second paths 54 and 55, an inlet port 56 and an outlet port 57. The first, second and third reactors 51, 52, and 53 can be realized by vessels. The first, second and third reactors 51, 52, and 53 are distanced from each other. The first and second reactors 51 and 52 are communicated with each other through the first path 54. The second and third reactors 52 and 53 are communicated with each other through the second path 55. The input port 56 is communicated with the first reactor 51. The outlet port 57 is communicated with the third reactor 53. A sample is supplied from the inlet port 56 into the first, second and/or third reactors 51, 52, and/or 53. A reactant that has been formed in the first, second and/or third reactors 51, 52, and/or 53 is discharged from the outlet port 57.

The first, second and third reactors 51, 52 and 53 are subject to temperature control by the temperature control apparatus 10. Thus, the first second and third reactors 51, 52 and 53 may be regarded as temperature controlled portions. The first second and third reactors 51, 52 and 53 may be configured to allow cultivations of cells and/or microorganisms. The first second and third reactors 51, 52 and 53 may also be configured to allow separations and reactions of chemical substances. Typical examples of the sample to be supplied to the microchip 50 may include, but are not limited to, culture mediums and solutions dissolved from reactants.

The temperature control unit 12 is configured to control temperatures of the first, second and third reactors 51, 52, and 53 of the microchip 50. The temperature control unit 12 may include, but is not limited to, first and second Peltier-type temperature control units 20 and 30 and a heater-type temperature control unit 40.

The first Peltier-type temperature control unit 20 may further include a first heat transfer unit 21 and a first Peltier module 22. The first heat transfer unit 21 may be disposed closely adjacent to the first reactor 51. The first Peltier module 22 may be disposed under the first heat transfer unit 21. The first Peltier module 22 may be thermally engaged with the first reactor 51 through the first heat transfer unit 21.

The second Peltier-type temperature control unit 30 may further include a second heat transfer unit 31 and a second Peltier module 32. The second heat transfer unit 31 may be disposed closely adjacent to the second reactor 52. The second Peltier module 32 may be disposed under the second heat transfer unit 31. The second Peltier module 32 may be thermally engaged with the second reactor 52 through the second heat transfer unit 31.

The number of the Peltier-type temperature control units and/or the heater-type temperature control unit are decided depending upon the number of the temperature controlled portions, namely the reactors of the microchip 50. The positions of the Peltier-type temperature control units and/or the heater-type temperature control unit are decided depending upon the positions of the temperature controlled portions, namely the reactors of the microchip 50.

The first and second heat transfer units 21 and 31 may be formed of a heat conductor. Typical examples of the heat conductor for the first and second heat transfer units 21 and 31 may include, but are not limited to, metals such as copper and aluminum and alloys, ceramics and heat conductive resins. The first and second Peltier-type temperature control units 20 and 30 may include first and second temperature detecting units, respectively.

The first and second temperature detecting units are configured to detect temperatures of the first and second heat transfer units 21 and 31. The first and second temperature detecting units are not illustrated. Each of the first and second temperature detecting units may include a thermister, a thermocouple, or a platinum resistance. The first and second temperature detecting units may be configured to detect first and second temperatures of the first and second heat transfer units 21 and 31 and convert the first and second detected temperatures into first and second temperature signals. The first and second temperature detecting units may be configured to supply the first and second temperature signals to a controller that is not illustrated.

Each of the first and second Peltier-type temperature control units 20 and 30 may be connected to a lead wire that is further connected to a power source and a controller, both of which are not illustrated. The lead wire supplies a power to each of the first and second Peltier-type temperature control units 20 and 30.

The first heat transfer unit 21 has first and second surfaces opposing each other. The first Peltier module 22 has first and second sides opposing each other. The first surface of the first heat transfer unit 21 may be closely adjacent to or in contact with the second side of the first Peltier module 22. The second surface of the first heat transfer unit 21 may be closely adjacent to the first reactor 51 and be in contact with the first surface of the microchip 50. The first heat transfer unit 21 may be interposed between the first reactor 51 and the first Peltier module 22. The first surface of the first heat transfer unit 21 may be bonded to the second side of the first Peltier module 22 by using an adhesive agent and a solder.

The second heat transfer unit 31 has first and second surfaces opposing each other. The second Peltier module 32 has first and second sides opposing each other. The first surface of the first heat transfer unit 31 may be closely adjacent to or in contact with the second side of the second Peltier module 32. The second surface of the second heat transfer unit 31 may be closely adjacent to the second reactor 52 and be in contact with the first surface of the microchip 50. The second heat transfer unit 31 may be interposed between the second reactor 52 and the second Peltier module 32. The first surface of the second heat transfer unit 31 may be bonded to the second side of the second Peltier module 32 by using the adhesive agent and the solder.

An application of a current to each of the first and second Peltier modules 22 and 32 in a first direction causes a heat generation reaction at the first side and an endothermic reaction at the second side of each of the first and second Peltier modules 22 and 32. Another application of a current to each of the first and second Peltier modules 22 and 32 in a second direction opposing to the first direction causes the heat generation reaction at the second side and the endothermic reaction at the first side of each of the first and second Peltier modules 22 and 32. Changing the direction of the current application changes the sides at which the heat generation reaction and the endothermic reaction are caused. The heat generation reaction may be considered to as a heat exhaustion reaction.

The current application in the first direction causes the first and second Peltier modules 22 and 32 to cool the first and second heat transfer units 21 and 32, thereby cooling the first and second reactors 51 and 52, respectively. The other current application in the second direction causes the first and second Peltier modules 22 and 32 to heat the first and second heat transfer units 21 and 32, thereby heating the first and second reactors 51 and 52, respectively. The first and second temperatures of the first and second heat transfer units 21 and 31 can be controlled by controlling the directions and the magnitudes of currents applied to the first and second Peltier modules 22 and 32, respectively. Thus, the first and second temperatures of the first and second reactors 51 and 52 can be controlled by controlling the directions and the magnitudes of currents applied to the first and second Peltier modules 22 and 32, respectively.

The first and second Peltier modules 22 and 32 can be controlled by the controller that is not illustrated. The controller receives the first and second temperature signals from the first and second temperature detecting units. The controller controls the directions and the magnitudes of currents applied to the first and second Peltier modules 22 and 32, based on or with reference to the first and second temperature signals. The controller also controls continuity and discontinuity of the current application to each of the first and second Peltier modules 22 and 32.

It is possible as a modification for each of the first and second Peltier-type temperature control units 20 and 30 to include the first and second Peltier modules 22 and 32 only but to be free of the first and second heat transfer units 21 and 31. In this case, the second surfaces of the first and second Peltier modules 22 and 32 are closely adjacent to or in contact with the first surface of the microchip 50.

The heater-type temperature control unit 40 may further include a third heat transfer unit 41 and a heater 42. The third heat transfer unit 41 may be made of a heat conductor. Typical examples of the heat conductor for the third heat transfer unit 41 may include, but are not limited to, metals such as copper and aluminum and alloys, ceramics and heat conductive resins. The heater-type temperature control unit 40 may include a third temperature detecting unit.

The third temperature detecting unit is configured to detect the temperature of the third heat transfer unit 41. The third temperature detecting unit is not illustrated. The third temperature detecting unit may include a thermister, a thermocouple, or a platinum resistance. The third temperature detecting unit may be configured to detect a third temperature of the third heat transfer unit 41 and convert the third detected temperature into a third temperature signal. The third temperature detecting unit may be configured to supply the third temperature signals to the controller that is not illustrated.

The third heat transfer unit 41 may be disposed closely adjacent to the third reactor 53. The heater 42 may be disposed under the third heat transfer unit 41. The heater 42 may be thermally engaged with the third reactor 53 through the third heat transfer unit 41.

The third heat transfer unit 41 has first and second surfaces opposing each other. The heater 42 has first and second sides opposing each other. The first surface of the third heat transfer unit 41 may be closely adjacent to or in contact with the second side of the heater 42. The second surface of the third heat transfer unit 41 may be closely adjacent to the third reactor 53 and be in contact with the first surface of the microchip 50. The third heat transfer unit 41 may be interposed between the third reactor 53 and the heater 42. The first surface of the third heat transfer unit 41 may be bonded to the second side of the heater 42 by using the adhesive agent and the solder.

An application of a current to the heater 42 causes a heat generation reaction. The heat generation reaction may be considered to as a heat exhaustion reaction. The third temperature of the third heat transfer unit 41 can be controlled by controlling the magnitude of a current applied to the heater 42. Thus, the third temperature of the third reactor 53 can be controlled by controlling the magnitude of a current applied to the heater 42.

The heater 42 can be controlled by the controller that is not illustrated. The controller receives the third temperature signal from the third temperature detecting unit. The controller controls the magnitudes of a current applied to the heater 42, based on or with reference to the third temperature signal. The controller also controls continuity and discontinuity of the current application to the heater 42.

It is possible as a modification for the heater-type temperature control unit 40 to include the heater 42 only but to be free of the third transfer unit 41. In this case, the second surface of the heater 42 is closely adjacent to or in contact with the first surface of the microchip 50.

A heat separating interposer having a low heat conductivity can be interposed between the heater 42 and the heat sink 11 so that the heat separating interposer reduces the heat transfer from the heater 42 to the heat sink 11. The heat separating interposer is not illustrated. The heat separating interposer may contribute to reduce a power that needs to control the temperature control. Typical examples of a material for the heat separating interposer may include, but are not limited to, ceramics and resins.

The heat sink 11 has a heat conductivity that is so high as to cause the radiation of a heat generated and/or exhausted by the first and second Peltier-type temperature control units 20 and 30. Typical examples of a material for the heat sink 11 may include, but are not limited to, metals such as copper and aluminum and alloys. The heat sink 11 may be disposed in an opposite side of the temperature control unit 12 to the side where the microchip 50 is disposed. In other words, the temperature control unit 12 is positioned between the heat sink 11 and the microchip 50. For example, the heat sink 11 may be disposed closely adjacent to or in contact with the first sides of the first and second Peltier modules 22 and 32 and the heater 42. The heat generated and/or exhausted by the first and second Peltier-type temperature control units 20 and 30 can be radiated through the heat sink 11. Optionally, an additional heat radiation mechanism such as a radiator fan or fans can be provided. For example, the radiator fan or fans can be provided to blow the heat sink 11 to further promote the heat radiation.

The frame 13 is disposed between the microchip 50 and the heat sink 11. The frame 13 may extend to surround or encompass the temperature control unit 12 that includes the first and second Peltier-type temperature control units 20 and 30 and the heater-type temperature control unit 40. The frame 13 may perform as a non-empty spacer to provide a closed-space 14 that is defined by the frame 13 and between the microchip 50 and the heat sink 11. In the closed-space 14, the temperature control unit 12 is provided. In other words, the first and second Peltier-type temperature control units 20 and 30 and the heater-type temperature control unit 40 are provided in the closed-space 14. The frame 13 may also perform as a supporter to support the microchip 50. The frame 13 may be made of a material having a poor heat conductivity such as a resin or a ceramics. The frame 13 may be secured or attached to the heat sink 11. For example, the frame 13 may be bonded to the heat sink 11 by a heat-insulating adhesive agent. The frame 13 may be integrally formed with the heat sink 11.

A sealing member 15 can be provided between the frame 13 and the microchip 50. The frame 13 may have first and second surfaces opposing each other. The first surface of the frame 13 is closely adjacent to or in contact with the heat sink 11. The second surface of the frame 13 is in contact with the sealing member 15 and is closely adjacent to the microchip 50. The sealing member 15 may be made of an elastic and deformable heat-insulating material such as a foamed rubber or a silicone resin. When the microchip 50 is not mounted on the temperature control apparatus 10, the top level of the sealing member 15 may be slightly higher than the top level of the first and second Peltier-type temperature control units 20 and 30 and the heater-type temperature control unit 40. When the microchip 50 is mounted on the temperature control apparatus 10, the sealing member 15 may be deformed so that the top level of the sealing member 15 is substantially the same as the top level of the first and second Peltier-type temperature control units 20 and 30 and the heater-type temperature control unit 40. In other words, when the microchip 50 is mounted on the temperature control apparatus 10, the first and second Peltier-type temperature control units 20 and 30 and the heater-type temperature control unit 40 are in contact with the first surface of the microchip 50 and closely adjacent to the first, second and third reactors 51, 52 and 53, respectively.

When the microchip 50 is mounted on the temperature control apparatus 10, the sealing member 15 is made into contact tightly with the first surface of the microchip 50 and the second surface of the frame 13 so as to highly seal the closed-space 14.

It is possible as a modification for the sealing member 15 to be fixed to the first surface of the microchip 50. In this case, the sealing member 15 may be bonded to the first surface of the microchip 50. It is also possible as a further modification for the sealing member 15 to be provided on each of the frame 13 and the first surface of the microchip 50.

It is also possible as a further modification for both the microchip 50 and the heat sink 11 to have projecting portions or ridged portions that are configured to be in contact with each other when the microchip 50 is amounted on the temperature control apparatus 10. It is also possible as a furthermore modification for either the microchip 50 or the heat sink 11 to have a projecting portion or a ridged portion that is configured to be in contact with the counterpart thereof.

The sealing member 15 may preferably have a highly heat-insulating property that reduces the heat conduction between the microchip 50 and the frame 13. Namely, the sealing member 15 and the frame 13 both having the highly heat-insulating properties may reduce the heat transfer between the heat sink 11 and the microchip 50. The frame 13 may preferably be shaped in a thin plate that provides a mechanical strength sufficient to support the microchip 50. The thin thickness of the frame 13 reduces a horizontal section area thereof. The reduction in the horizontal section area of the frame 13 may contribute to reduce the heat transfer between the heat sink 11 and the microchip 50. The reduction in the heat transfer between the heat sink 11 and the microchip 50 may also contribute to reduce the power consumption by the first and second Peltier modules 22 and 32.

A cover 60 may optionally be provided which covers the microchip 50. The cover 60 may be positioned in an opposite side of the microchip 50 to the side, to which the temperature control unit 12 is closely adjacent. The first surface of the microchip 50 is closely adjacent to or in contact with the temperature control unit 12. The second surface of the microchip 50 is closely adjacent to or in contact with the cover 60. The cover 60 is disposed over the microchip 50. The microchip 50 is pressed or forced toward the temperature control unit 12 by the dead-weights of the microchip 50 and the cover 60, thereby causing the deformation of the sealing member 15 between the microchip 50 and the frame 13. The deformation of the sealing member 15 tightly seals the closed-space 14.

It is possible as a modification for the cover 60 to be actively pressed to the microchip 50 by using a dead-weight or an elastic member. Actively pressing the cover 60 toward the microchip 50 promotes a further deformation of the sealing member 15, thereby furthermore tightly sealing the closed-space 14.

The temperature control unit 10 may optionally include a dehumidifier 70 that is configured to dehumidify the closed-space 14. The dehumidifier 70 may optionally include a gas supplier 71 and a first and second gas passage member 72. The gas supplier 71 may be configured to contain or accumulate a dehumidified gas. Typical examples of the dehumidified gas may include, but are not limited to, a dehumidified nitrogen gas, a dehumidified argon gas, and a dehumidified air. The temperature control unit 10 may also optionally include a gas discharge unit that is configured to discharge the gas existent in the closed-space 14. The gas discharge unit may include a second gas passage member 73.

The first and second gas passage members 72 and 73 extend through or penetrate the heat sink 11 so that the first gas passage member 72 consummates between the gas supplier 71 and the closed-space 14, and the second gas passage member 72 consummates between the closed-space 14 and the outside space of the temperature control apparatus 10. Namely, the first and second gas passage members 72 and 73 provide first and second gas passages 74 and 75. The first gas passage 74 communicates between the gas supplier 71 and the closed-space 14. The second gas passage 75 communicates between the closed-space 14 and the outside space of the temperature control apparatus 10. First and second valves 76 and 77 may optionally be provided on the first and second gas passages 74 and 75, respectively. The first and second valves 76 and 77 may be configured to open and close the first and second gas passages 74 and 75.

The first gas passage 74 has first and second ends opposing each other. The first end of the first gas passage 74 communicates with the gas supplier 71. The second end of the first gas passage 74 communicates with the closed-space 14. The second gas passage 75 has first and second ends opposing each other. The first end of the second passage 75 communicates with the outside space of the temperature control apparatus 10. The second end of the second passage 75 communicates with the closed-space 14.

After the microchip 50 is mounted on the temperature control apparatus 10, the dehumidified gas is supplied from the gas supplier 71 through the first gas passage 74 to the closed-space 14, while the existing gas in the closed-space 14 is discharged from the closed-space 14 through the second gas passage 75 to the outside space of the temperature control apparatus 10.

The heat sink 11 may optionally have a humidity sensor 16 that is configured to sense or detect a humidity of the closed-space 14 and generate a humidity signal that represents the detected humidity. The humidity sensor 16 may be connected to the controller that is not illustrated so that the humidity sensor 16 supplies the humidity signal to the controller. The controller may also be connected to the first and second valves 76 and 77 to open or close the first and second valves 76 and 77 with reference to the humidity signal, thereby controlling the supply of the dehumidified gas into the closed-space 14 and control the humidity of the closed-place 14.

Operations of the temperature control apparatus 10 to control the temperatures of the first, second and third reactors 51, 52 and 53 of the microchip 50 will be described.

The microchip 50 is mounted on the temperature control apparatus 10. For example, the first surface of the microchip 50 is made into contact with the sealing member 15 over the frame 13, whereby the sealing member 15 is deformed so that the first surface of the microchip 50 is made into contact tightly with the first and second Peltier-type temperature control units 20 and 30 and the heater-type temperature control unit 40. The sealing member 15 tightly contacts with the microchip 50 and the frame 13, thereby tightly sealing the closed-space 14. Further, the cover 60 is disposed on the second surface of the microchip 50 so that the microchip 50 is pushed toward the temperature control apparatus 10, thereby causing the sealing member 15 to tightly seal the closed-space 14 and also causing the microchip 50 to tightly contact with the first and second Peltier-type temperature control units 20 and 30 and the heater-type temperature control unit 40.

After the microchip 50 is mounted on the temperature control apparatus 10, then the closed-space 14 is defined by the frame 13 and between the microchip 50 and the heat sink 11 so that the first and second Peltier-type temperature control units 20 and 30 and the heater-type temperature control unit 40 are confined in the closed-space 14. After the closed-space 14 is formed, then the controller that is not illustrated operates to open the first and second valves 76 and 77, thereby supplying the dehumidified gas from the gas supplier 71 into the closed-space 14, while the existing gas in the closed-space 14 being discharged from the closed-space 14 to the outside space of the temperature control apparatus 10. The humidity sensor 16 detects the humidity of the closed-space 14 and generates the humidity signal that represents the detected humidity of the closed-space 14. The controller receives the humidity signal from the humidity sensor 16. The controller opens and closes the first and second valves 76 and 77 based on the humidity signal, thereby controlling the humidity of the closed-space 14.

For example, the controller continues to open the first and second valves 76 and 77 to continue to supply the dehumidified gas into the closed-space 14 until the humidity detected by the humidity sensor 16 is dropped to a predetermined humidity level. The predetermined humidity level is decided so that, at the predetermined humidity level, the dew point of the atmosphere in the closed-space 14 becomes lower than the lower limit of the controllable temperature range of the first and second Peltier-type temperature control units 20 and 30. The dew point of the atmosphere of the closed-space 14 depends on the humidity thereof. When the dew point of the atmosphere in the closed-space 14 becomes lower than the lower limit of the controllable temperature range of the first and second Peltier-type temperature control units 20 and 30, the controller closes the first and second valves 76 and 77 to discontinue the supply of the dehumidified gas into the closed-space 14.

In order to securely prevent the moisture condensation, the humidity of the closed-space 14 is so controlled that the dew point of the atmosphere in the closed-space 14 is preferably lower by 3° C. and more preferably lower by 5° C. than the lower limit of the controllable temperature range of the first and second Peltier-type temperature control units 20 and 30.

After the first and second valves 20 and 30 are closed to discontinue the supply of the dehumidified gas into the closed-space 14, the controller applies currents to the first and second Peltier-type temperature control units 20 and 30 and the heater-type temperature control unit 40, thereby causing the first and second Peltier-type temperature control units 20 and 30 and the heater-type temperature control unit 40 to perform the temperature controls of the temperature controlled portions, for example, the first, second and third reactors 51, 52, and 53. The closed-space 14 accommodates the first and second Peltier-type temperature control units 20 and 30 and the heater-type temperature control unit 40. The closed-space 14 is filled with the dehumidified gas that has a sufficiently low humidity to prevent the moisture condensation on the exposed surfaces of the first and second Peltier-type temperature control units 20 and 30 if the first and second Peltier-type temperature control units 20 and 30 perform to cool the first and second reactors 51 and 52 at the lower limit of the controllable temperature range. No appearance of moisture condensation on the exposed surfaces of the first and second Peltier-type temperature control units 20 and 30 may prevent the first and second Peltier-type temperature control units 20 and 30 from being broken.

After the temperature control to the microchip 50 has been completed, then the microchip 50 is removed from the temperature control apparatus 10. The closed-space 14 is exposed to the outer space or the atmosphere so that the atmosphere flows around the first and second Peltier-type temperature control units 20 and 30 and the heater-type temperature control unit 40.

A new microchip 50 is then mounted on the temperature control apparatus 10 so that the new microchip 50 is subject to the temperature control by the temperature control apparatus 10. The dehumidified gas is again supplied top the closed-space 14 in the same manner as described above. The microchip 50 is subjected to the temperature control, while the closed-space 14 is filled with the dehumidified gas.

If the temperature control to the microchip 50 is performed for a long time, it might be possible that an outside atmosphere having moisture be entered into the closed-space 14 through a gap between the sealing member 15 and the microchip 50. Before the humidity of the closed-space 14 that is detected by the humidity sensor 16 reaches the upper limit of an allowable humidity range, the controller opens the first and second valves 76 and 77 to start the supply of the dehumidified gas into the closed-space 14, thereby dropping the humidity and maintaining the humidity in the allowable humidity range.

The temperature control of the microchip 50 can be performed for a long time while continuing the supply of the dehumidified gas into the closed-space 14 so as to prevent the moisture condensation from appearing on the exposed surfaces of the first and second Peltier-type temperature control units 20 and 30. This may prevent the first and second Peltier-type temperature control units 20 and 30 from being broken. Typical examples of a dehumidified gas may include, but are not limited to, a dehumidified air, a dehumidified nitrogen gas, and a dehumidified argon gas.

As described above, the temperature control unit 12 includes the first and second Peltier-type temperature control units 20 and 30 and the heater-type temperature control unit 40. The temperature control unit 12 is surrounded by the frame 13. The temperature control apparatus 10 is configured to prevent any substantive increase in size of each of the first and second Peltier-type temperature control units 20 and 30 and the heater-type temperature control unit 40. The temperature control apparatus 10 has no heat conductor adjacent to the first and second Peltier-type temperature control units 20 and 30 and the heater-type temperature control unit 40. The sizes and the positions of the first and second Peltier-type temperature control units 20 and 30 and the heater-type temperature control unit 40 may be decided based on the sizes of the first, second and third reactors 51, 52 and 53 of the microchip 50. The temperature control apparatus 10 is also configured to prevent the heat transfer from the heat sink 11 to the microchip 50. The temperature control apparatus 10 is thus configured to perform highly accurate temperature controls to the temperature controlled portions, for example, the first, second and third reactors 51, 52 and 53 of the microchip 50. The temperature control apparatus 10 is further configured to reduce the power consumptions by the first and second Peltier-type temperature control units 20 and 30.

Figure 4:
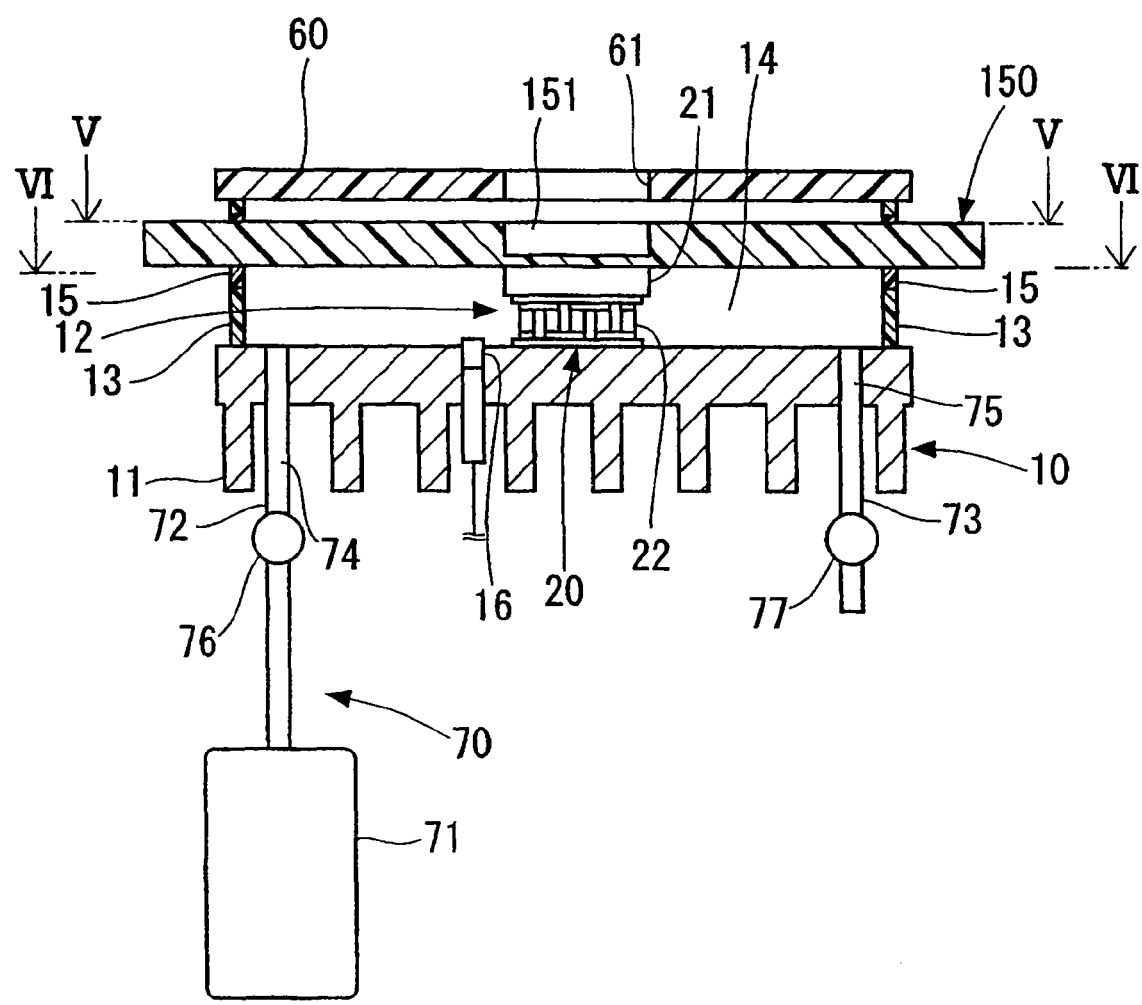
FIG. 4 is a cross sectional elevation view illustrating a temperature control apparatus on which a microchip is mounded in accordance with a modification of the first embodiment of the present invention.
Figure 5:
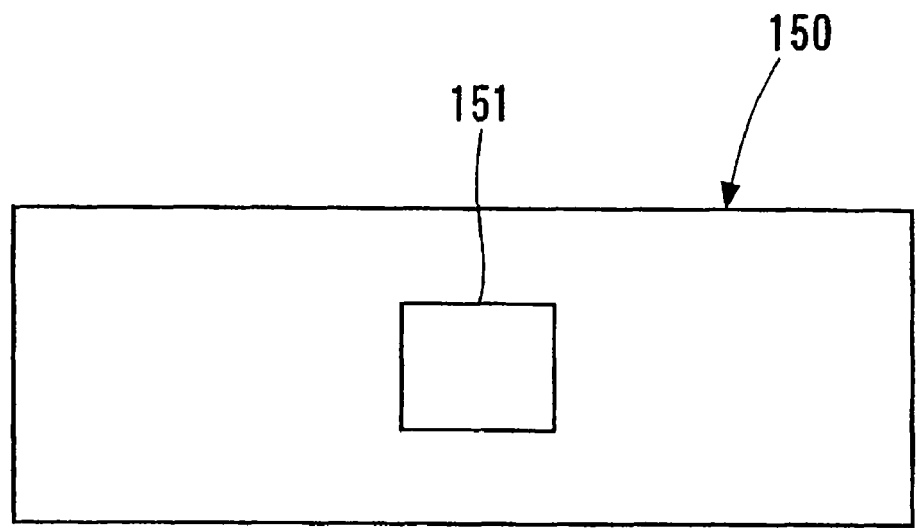
FIG. 5 is a cross sectional horizontal view illustrating the microchip, taken along a V-V line of FIG. 4.
Figure 6:
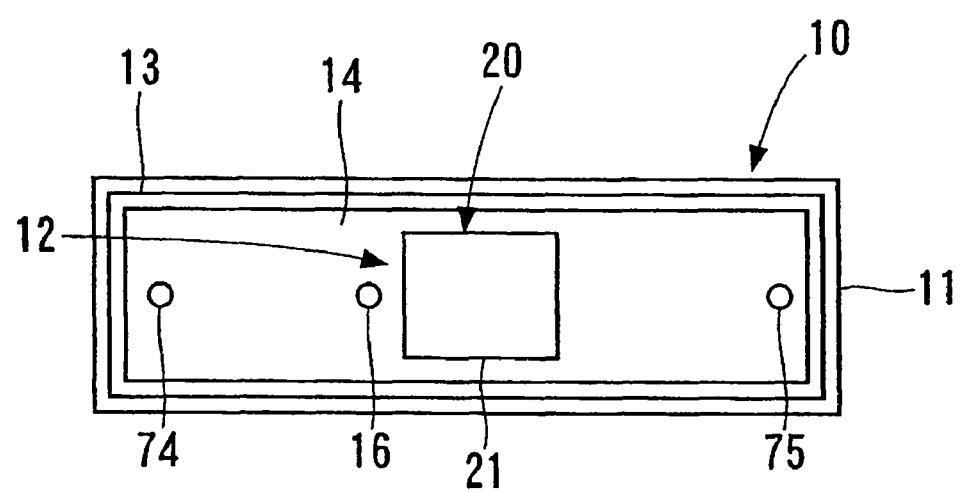
FIG. 6 is a cross sectional horizontal view illustrating the temperature control apparatus, taken along a VI-VI line of FIG. 4.

Modifications:

A modification of the first embodiment will be described. FIG. 4 is a cross sectional elevation view illustrating a temperature control apparatus on which a microchip is mounted in accordance with a modification of the first embodiment of the present invention. FIG. 5 is a cross sectional horizontal view illustrating the microchip, taken along a V-V line of FIG. 4. FIG. 6 is a cross sectional horizontal view illustrating the temperature control apparatus, taken along a VI-VI line of FIG. 4.

A temperature control apparatus 10 is configured to allow a microchip 150 to be removably mounted thereon. The temperature control apparatus 10 may include, but is not limited to, the heat sink 11, the temperature control unit 12, and the frame 13. The following descriptions will focus on differences of the modification from the first embodiment. A typical example of the microchip 150 may be, but is not limited to, a slide glass of a microscope. The microchip 150 includes a single reactor 151, into which a sample is introduced. The sample is to be subject to an observation by the microscope. The control unit 12 may include the first Peltier-type temperature control unit 20 that is positioned closely adjacent to the single reactor 151. The cover 60 has an opening 61 that is positioned over the single reactor 151 so that the sample is introduced through the opening 61 into the single reactor 151.

The sample in the single reactor 151 is observed through the opening 61. The cover 61 with the opening 61 makes it easy to continue to observe the sample in the single reactor 151, while the single reactor 151 is continued to be subject to the temperature control by the first Peltier-type temperature control unit 20. The sample in the single reactor 151 can be removed from the opening 61.

The temperature control unit 12 can be configured to be adapted to a variety of microchip 50. Namely, the size and position of one or more Peltier-type temperature control units can be decided based on the size and position of the temperature controlled portion, for example, the reactor of the microchip 50. The number of the Peltier-type temperature control units can be decided based on the number of the temperature controlled portions, for example, the reactors of the microchip 50.

Second Embodiment

Figure 7:
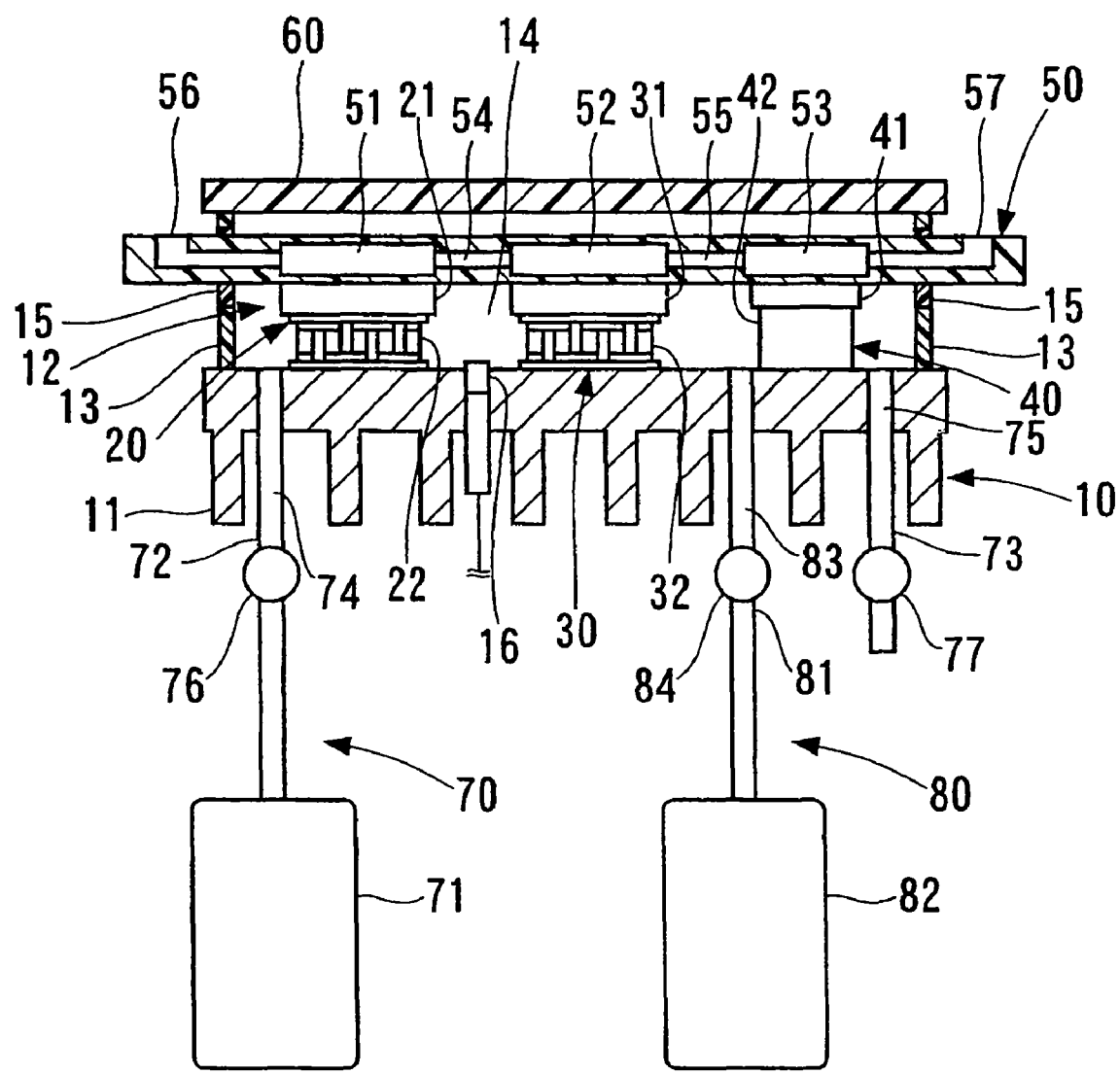
FIG. 7 is a cross sectional elevation view illustrating a temperature control apparatus on which a microchip is mounted in accordance with a second embodiment of the present invention.

FIG. 7 is a cross sectional elevation view illustrating a temperature control apparatus on which a microchip is mounded in accordance with a second embodiment of the present invention.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first second and third reactors 51, 52 and 53 may be regarded as temperature controlled portions. The microchip 50 of the second embodiment is the same in structure as the microchip of the first embodiment.

The temperature control apparatus 10 may include, but is not limited to, the heat sink 11, the temperature control unit 12, and the frame 13. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the second embodiment are the same in structure as those of the first embodiment.

The frame 13 is disposed between the microchip 50 and the heat sink 11. The frame 13 may extend to surround or encompass the temperature control unit 12 that includes the first and second Peltier-type temperature control units 20 and 30 and the heater-type temperature control unit 40. The frame 13 may perform as a non-empty spacer to provide a closed-space 14 that is defined by the frame 13 and between the microchip 50 and the heat sink 11. The frame 13 of the second embodiment is the same as the frame 13 of the first embodiment.

The cover 60 may optionally be provided which covers the microchip 50. The cover 60 of the second embodiment is the same as the cover 60 of the first embodiment.

The temperature control unit 10 may include a dehumidifier 70 that is configured to dehumidify the closed-space 14. The dehumidifier 70 of the second embodiment is the same as the dehumidifier 70 of the first embodiment. The temperature control unit 10 may also optionally include a gas discharge unit that is configured to discharge the gas existent in the closed-space 14. The gas discharge unit may include a second gas passage member 73. The gas discharge unit of the second embodiment is the same as the gas discharge unit of the first embodiment.

The following descriptions will focus on differences of the second embodiment from the first embodiment.

The temperature control apparatus 10 may further include a depressurizing unit 80 that is configured to depressurize the closed-space 14. The depressurizing unit 80 may include, but is not limited to, a third gas passage member 81, and a depressurizing device 82. The third gas passage member 81 may extend through or penetrate the heat sink 11, so that the third gas passage member 81 communicates between the closed-space 14 and the depressurizing device 82. The third gas passage member 81 can be configured to provide a third gas passage 83 that communicates between the closed-space 14 and the depressurizing device 82. A third valve 84 may be provided on the third gas passage member 81. The third valve 84 may be configured to open and close the third gas passage 83.

The passage 83 has first and second ends opposing each other. The first end of the passage 83 communicates with the depressurizing device 82. The second end of the passage 83 communicates with the closed-space 14. The depressurizing device 82 can be realized by, but not limited to, a suction pump or a vacuum pump.

After the microchip 50 is mounted on the temperature control apparatus 10, the depressurizing unit 80 is operated to depressurize the closed-space 14, while the first and second valves 76 and 77 remain closed and the third valve 84 remains open. The dehumidifier 70 remains not operated during the depressurizing process by the depressurizing unit 80. The depressurizing process is continued by the depressurizing unit 80 until the pressure of the closed-space reaches a predetermined pressure value. After the depressurizing operation by the depressurizing unit 80 has been completed, then the first valve 76 is opened and the second and third valves 77 and 84 remain closed so that the dehumidifier 70 is operated to supply the dehumidified gas from the gas supplier 71 through the first gas passage 74 to the closed-space 14.

The depressurizing process being performed by the depressurizing unit 80 prior to the dehumidified gas supplying process performed by the dehumidifier 70 may realize that the moisture-containing gas extending in the closed-space 14 be replaced with the dehumidified gas. Namely, the depressurizing process being performed by the depressurizing unit 80 prior to the dehumidified gas supplying process performed by the dehumidifier 70 may shorten the time after the microchip 50 is mounted on the temperature control apparatus 10 before the temperature control processes are performed by the first and second Peltier-type temperature control units 20 and 30 and the heater-type temperature control unit 40.

Further, the depressurizing process being performed by the depressurizing unit 80 prior to the dehumidified gas supplying process performed by the dehumidifier 70 may further reduce the amount of moisture of the residual gas in the closed-space 14, thereby preventing moisture condensation from appearing on the exposed surfaces of the first and second Peltier-type temperature control units 20 and 30.

In order to further reduce the moisture degree of the gas in the closed-space 14, it is possible as a modification to repeat the depressurizing process and the dehumidified gas supplying process alternately.

Third Embodiment

Figure 8:
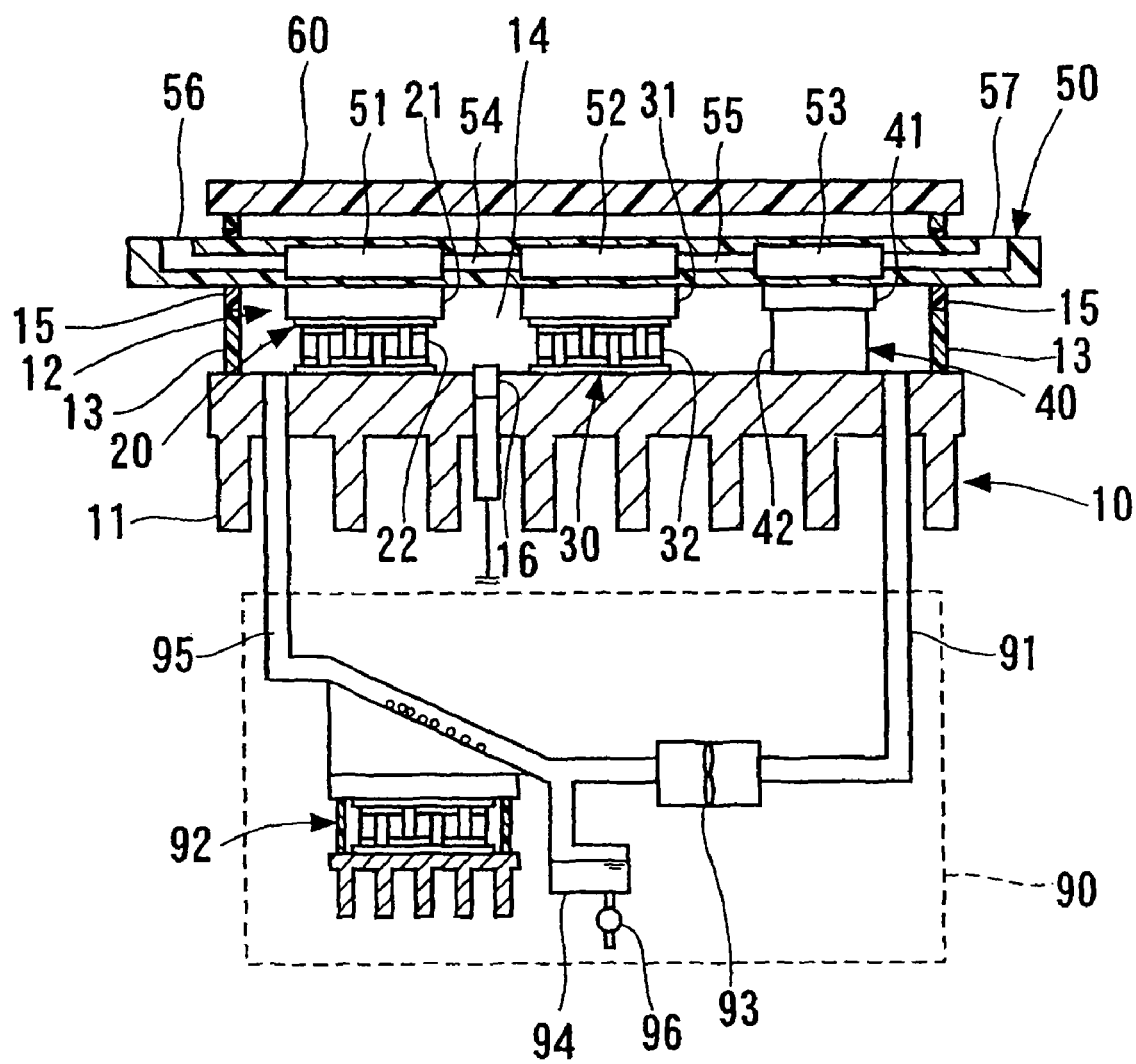
FIG. 8 is a cross sectional elevation view illustrating a temperature control apparatus on which a microchip is mounted in accordance with a third embodiment of the present invention.

FIG. 8 is a cross sectional elevation view illustrating a temperature control apparatus on which a microchip is mounded in accordance with a third embodiment of the present invention.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first second and third reactors 51, 52 and 53 may be regarded as temperature controlled portions. The microchip 50 of the third embodiment is the same in structure as the microchip of the first embodiment.

The temperature control apparatus 10 may include, but is not limited to, the heat sink 11, the temperature control unit 12, and the frame 13. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the third embodiment are the same in structure as those of the first embodiment.

The frame 13 is disposed between the microchip 50 and the heat sink 11. The frame 13 may extend to surround or encompass the temperature control unit 12 that includes the first and second Peltier-type temperature control units 20 and 30 and the heater-type temperature control unit 40. The frame 13 may perform as a non-empty spacer to provide a closed-space 14 that is defined by the frame 13 and between the microchip 50 and the heat sink 11. The frame 13 of the third embodiment is the same as the frame 13 of the first embodiment.

The cover 60 may optionally be provided which covers the microchip 50. The cover 60 of the third embodiment is the same as the cover 60 of the first embodiment.

The following descriptions will focus on differences of the third embodiment from the first embodiment.

The temperature control unit 10 may include a dehumidifier 90 that is configured to dehumidify the closed-space 14. The dehumidifier 90 of the third embodiment is different from the dehumidifier 70 of the first embodiment. The dehumidifier 90 may include, but is not limited to, a gas circulation passage member 91, a cooling unit 92, a circulation pump 93 and a dehydration unit 94.

The gas circulation passage member 91 may be configured to extend through the heat sink 11 so that the gas circulation passage member 91 communicates with the closed-space 14. The gas circulation passage member 91 has first and second ends opposing each other. The first and second ends of the gas circulation passage member 91 communicate with the closed-space 14. The gas in the closed-space 14 is circulated through the gas circulation passage member 91. The gas circulation passage member 91 may be configured to provide a gas circulation passage 95 that communicates with the closed-space 14. The gas in the closed-space 14 is circulated through the gas circulation passage 95.

The cooling unit 92 may be disposed closely adjacent to or in contact with a portion of the gas circulation passage member 91. The cooling unit 92 may be configured to cool the first portion of the gas circulation passage member 91, thereby cooling a circulating gas that is flowing through the first portion of the gas circulation passage member 91. The cooling unit 92 may be realized by a known technique. For example, the cooling unit 92 may include, but is not limited to, a Peltier-type temperature control unit. Cooling the first part of the gas circulation passage member 91 by the cooling unit 92 causes a moisture condensation of the circulating gas on the inner wall of the first portion of the gas circulation passage member 91, thereby forming water drops on the inner wall of the first portion of the gas circulation passage member 91. The first portion of the gas circulation passage member 91 is inclined in the downstream direction. In other wards, the second portion of the gas circulation passage member 91 is declined in the upstream direction. The first portion of the gas circulation passage member 91 has upstream and downstream ends. The upstream end of the first portion of the gas circulation passage member 91 has the highest level in the first portion thereof. The downstream end of the first portion of the gas circulation passage member 91 has the lowest level in the first portion thereof. The inclination of the first portion of the gas circulation passage member 91 is terminated with the upstream end. The declination of the first portion of the gas circulation passage member 91 is terminated with the downstream end.

The circulation pump 93 may be disposed on a second portion of the gas circulation passage member 91. The second portion of the gas circulation passage member 91 is upstream with reference to the first portion of the gas circulation passage member 91. The circulation pump 93 may be disposed on the gas circulation passage 95. The circulation pump 93 may be configured to be operated to form or generate a circulation flow of the gas through the gas circulation passage 95.

The dehydration unit 94 may be disposed to be connected to a third portion of the gas circulation passage member 91. The third portion may be interposed between the first and second portions of the gas circulation passage member 91. The third portion may be disposed adjacent to the upstream end of the first portion of the gas circulation passage member 91.

The first portion of the first portion of the gas circulation passage member 91 is cooled by the cooling unit 92, thereby causing the moisture condensation on the inner wall of the first portion of the gas circulation passage member 91. The moisture condensation forms water drops on the wall of the first portion of the gas circulation passage member 91. The water drops flow down in the upstream direction on the declined inner wall of the first portion of the gas circulation passage member 91 so that the water drops flow into the dehydration unit 94. The dehydration unit 94 may be configured to contain or accumulate water. The dehydration unit 94 may have a discharge valve 96. The water in the dehydration unit 94 may be discharged to the outside through the discharge valve 96, while the discharge valve 96 is opened.

The cooling unit 92 may be configured to maintain the first portion of the gas circulation passage member 91 to be lower than a predetermined temperature that has previously been set. The cooling unit 92 may be realized not only by the Peltier-type temperature control unit but also other cooling device that utilizes a refrigeration cycle such as a heat pump.

In order to securely prevent the moisture condensation, the humidity of the closed-space 14 is so controlled that the dew point of the atmosphere in the closed-space 14 is preferably lower by 3° C. and more preferably lower by 5° C. than the lower limit of the controllable temperature range of the first and second Peltier-type temperature control units 20 and 30.

After the microchip 50 is mounted on the temperature control apparatus 10, the controller that is not illustrated causes the circulation pump to operate to form a circulation flow of the gas through the closed-space 14 and the gas circulation passage 95. Namely, the moisture-containing gas in the closed-space 14 is circulated through the gas circulation passage 95. When the circulating gas flows through the first portion of the gas circulation passage member 91, the circulating gas is cooled by the cooling unit 92. The moisture included in the gas is condensed to form water drops on the inner wall of the first portion of the gas circulation passage member 91, thereby reducing the amount of moisture contained in the circulating gas that enters into the closed-space 14. Thus, the gas existing in the closed-space 14 is reduced in moisture level. The circulating pump 93 continues to operate until the moisture level of the gas in the closed-space 14 becomes lower than the predetermined moisture level.

After the moisture level of the gas in the closed-space 14 has become lower than the predetermined moisture level, then the first and second Peltier-type temperature control units 20 and 30 and the heater-type temperature control unit 40 will start to perform the temperature control processes for controlling the first, second and third temperatures of the first, second and third reactors 51, 52 and 53 of the microchip 50.

During the temperature control processes, the gas in the closed-space 14 remains dehumidified by the dehumidifier 90 to prevent moisture condensation on the exposed surfaces of the first and second Peltier-type temperature control units 20 and 30, thereby preventing the first and second Peltier-type temperature control units 20 and 30 from being broken.

Fourth Embodiment

Figure 9:
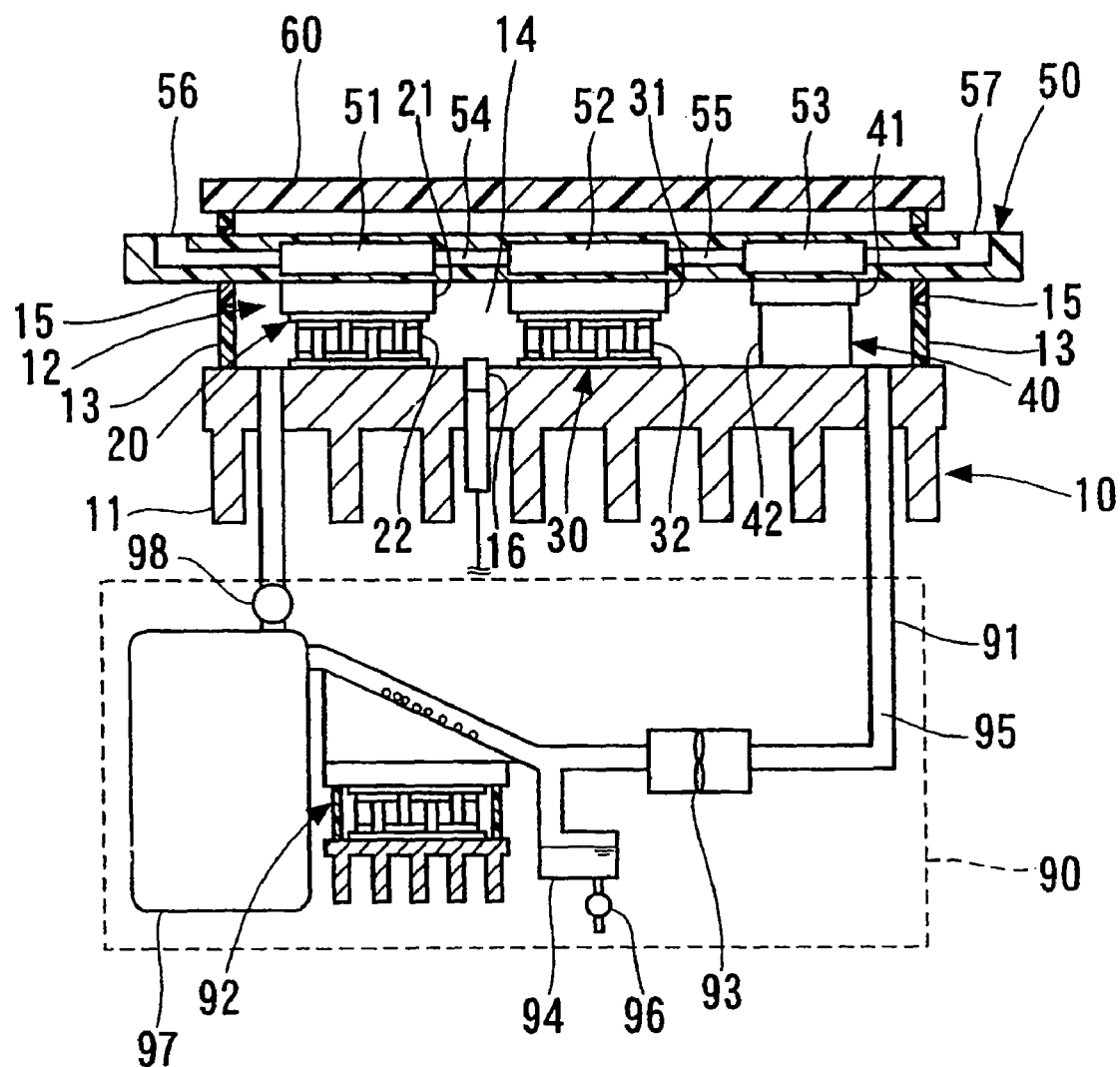
FIG. 9 is a cross sectional elevation view illustrating a temperature control apparatus on which a microchip is mounted in accordance with a fourth embodiment of the present invention.

FIG. 9 is a cross sectional elevation view illustrating a temperature control apparatus on which a microchip is mounted in accordance with a fourth embodiment of the present invention.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first, second and third reactors 51, 52 and 53 may be regarded as temperature controlled portions. The microchip 50 of the fourth embodiment is the same in structure as the microchip of the third embodiment.

The temperature control apparatus 10 may include, but is not limited to, the heat sink 11, the temperature control unit 12, the frame 13, and the dehumidifier 90. The heat sink 11 of the fourth embodiment is the same in structure as the heat sink 11 of the third embodiment. The temperature control unit 12 of the fourth embodiment is the same in structure as the temperature control unit 12 of the third embodiment. The frame 13 of the fourth embodiment is the same in structure as the frame 13 of the third embodiment. The dehumidifier 90 of the fourth embodiment is different in structure as the dehumidifier 90 of the third embodiment.

The following descriptions will focus on differences of the fourth embodiment from the third embodiment.

The temperature control unit 10 may include the dehumidifier 90 that is configured to dehumidify the closed-space 14. The dehumidifier 90 of the fourth embodiment is different from the dehumidifier 70 of the third embodiment. The dehumidifier 90 may include, but is not limited to, the gas circulation passage member 91, the cooling unit 91, the circulation pump 93, the dehydration unit 94, the discharge valve 96, a gas supply unit 97, and a fourth valve 98.

The gas supply unit 97 may be configured to contain or reserve the circulating gas that has been dehumidified while the circulation gas having flown through the first portion of the gas circulation passage member 91, provided that the first portion of the gas circulation passage member 91 remains cooled by the cooling unit 92. The gas supply unit 97 may be disposed adjacent to the downstream end of the first portion of the gas circulation passage member 91. The fourth valve 98 may be disposed downstream with reference to the gas supply unit 97. The dehumidified gas is then supplied from the gas supply unit 97 to the closed-space 14, while the fourth valve 98 remains open.

The gas supply unit 97 contains the dehumidified gas and supplies the same into the closed-space 14. The gas supply unit 97 replaces the existing gas in the closed-space 14 with the dehumidified gas more quickly.

It is possible as a modification for the temperature control apparatus 10 to further include a depressurizing unit that is configured to depressurize the closed-space 14. The depressurizing unit may be realized by the depressurizing unit 80 as shown in FIG. 7 of the second embodiment. As described in the second embodiment, the depressurizing unit 80 may include, but is not limited to, the third gas passage member 81, and the depressurizing device 82. The passage member 81 may extend through or penetrate the heat sink 11, so that the third gas passage member 81 communicates between the closed-space 14 and the depressurizing device 82. The third gas passage member 81 can be configured to provide the third gas passage 83 that communicates between the closed-space 14 and the depressurizing device 82. The third valve 84 may be provided on the third gas passage member 81. The third valve 84 may be configured to open and close the third gas passage member 81.

The passage 83 has first and second ends opposing each other. The first end of the passage 83 communicates with the depressurizing device 82. The second end of the passage 83 communicates with the closed-space 14. The depressurizing device 82 can be realized by, but not limited to, a suction pump or a vacuum pump.

After the microchip 50 is mounted on the temperature control apparatus 10, the depressurizing unit 80 is operated to depressurize the closed-space 14, while the valve 98 remains closed and the third valve 84 remains open. The dehumidifier 90 remains not operated during the depressurizing process by the depressurizing unit 80. The depressurizing process is continued by the depressurizing unit 80 until the pressure of the closed-space reaches a predetermined pressure value. After the depressurizing operation by the depressurizing unit 80 has been completed, then the calculation pump 93 is operated to cultrate the depressurized gas through the closed-space 14 and the gas circulation passage 95.

When the depressurized gas flows through the first portion of the gas circulation passage member 91, the depressurized gas is cooled by the cooling unit 92. The moisture included in the depressurized gas is condensed to form water drops on the inner wall of the first portion of the gas circulation passage member 91, thereby forming a dehumidified gas. The dehumidified gas is then contained in the gas supply unit 97, while the fourth valve 98 remains closed. The fourth valve 98 is then opened to supply the dehumidified gas into the closed-space 14. Thus, the gas existing in the closed-space 14 is reduced in moisture level.

The depressurizing process may be performed by the depressurizing unit before the humidifying process is performed by the dehumidifier 90, thereby further reducing the moisture level more quickly.

Fifth Embodiment

Figure 10:
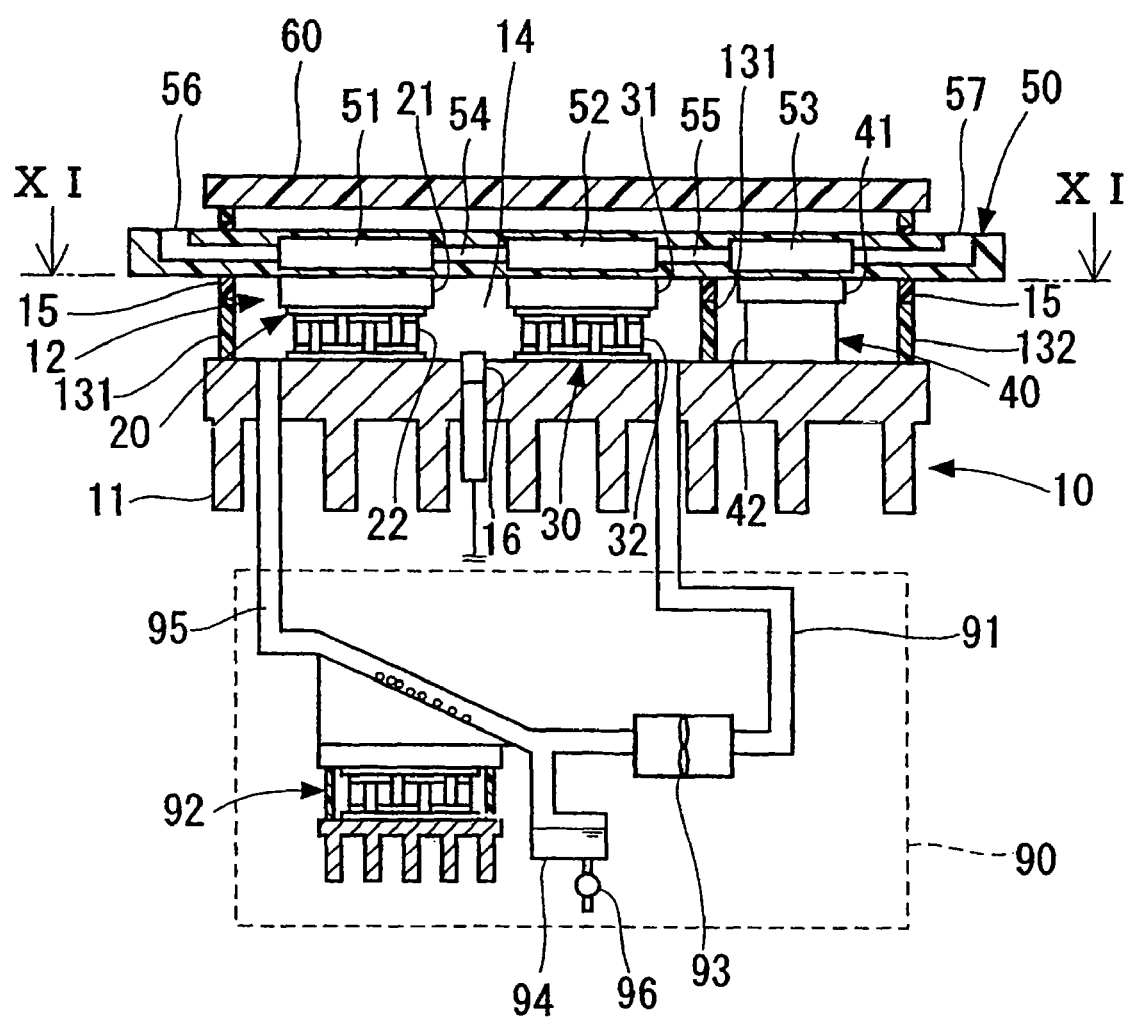
FIG. 10 is a cross sectional elevation view illustrating a temperature control apparatus on which a microchip is mounted in accordance with a fifth embodiment of the present invention.
Figure 11:
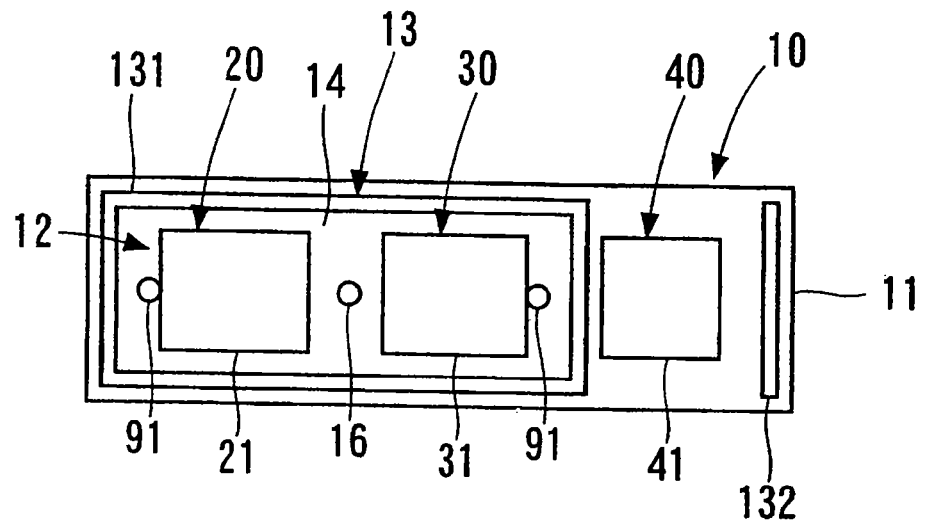
FIG. 11 is a cross sectional horizontal view illustrating the temperature control apparatus, taken along a XI-Xi line of FIG. 10.

FIG. 10 is a cross sectional elevation view illustrating a temperature control apparatus on which a microchip is mounded in accordance with a fifth embodiment of the present invention. FIG. 11 is a cross sectional horizontal view illustrating the temperature control apparatus, taken along a XI-Xi line of FIG. 10.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first second and third reactors 51, 52 and 53 may be regarded as temperature controlled portions. The microchip 50 of the fifth embodiment is the same in structure as the microchip of the first embodiment.

The temperature control apparatus 10 may include, but is not limited to, the heat sink 11, the temperature control unit 12, and the frame 13. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the fifth embodiment are the same in structure as those of the first embodiment.

The cover 60 may optionally be provided which covers the microchip 50. The cover 60 of the fifth embodiment is the same as the cover 60 of the first embodiment.

The following descriptions will focus on differences of the fifth embodiment from the first embodiment.

The frame 13 is disposed between the microchip 50 and the heat sink 11. The frame 13 of the fifth embodiment is different from the frame 13 of the first embodiment. The frame 13 may further include a first frame portion 131 and a second frame portion 132. The first frame portion 131 may extend to partially surround or encompass the temperature control unit 12 that includes the first and second Peltier-type temperature control units 20 and 30. For example, the first frame portion 131 may be configured to surround or encompass the first and second Peltier-type temperature control units 20 and 30. The first frame portion 131 may be configured not to surround or encompass the heater-type temperature control unit 40. The first frame portion 131 may perform as a first non-empty spacer to provide a first closed-space 14 that is defined by the first frame portion 131 and between the microchip 50 and the heat sink 11. The first closed-space 14 of the fifth embodiment contains only the first and second Peltier-type temperature control units 20 and 30 but does not contain the heater-type temperature control unit 40.

The second frame portion 132 may extend outside of the heater-type temperature control unit 40. The second frame 132 does not surround or encompass the heater-type temperature control unit 40 so that the heater-type temperature control unit 40 is disposed between the first and second frame portions 131 and 132. The heater-type temperature control unit 40 is exposed to the outside space of the temperature control apparatus 10. The second frame portion 132 may support the side portion of the microchip 50. The heater-type temperature control unit 40 may be configured to heat the third reactor 53 but not to cool the third reactor 53. The heater-type temperature control unit 40 is free from the problem with the moisture condensation on the exposed surface thereof. Thus, it is unnecessary to dehumidify the gas or atmosphere around the heater-type temperature control unit 40. This means that it is unnecessary to dispose the heater-type temperature control unit 40 in the closed-space 14.

The first and second Peltier-type temperature control units 20 and 30 may be configured to show a temperature drop to a lower temperature than room temperature. When the first and second Peltier-type temperature control units 20 and 30 have a lower temperature than room temperature, the moisture condensation is caused on the exposed surfaces of the first and second Peltier-type temperature control units 20 and 30. Thus, it is preferable that at least the first and second Peltier-type temperature control units 20 and 30 are disposed in the closed-space 14. The moisture level of the closed-space is maintained lower than the predetermined level, while the first and second Peltier-type temperature control units 20 and 30 are operated.

The closed-space 14 that surrounds the first and second Peltier-type temperature control units 20 and 30 has a smaller volume than the closed-space 14 that surrounds not only the first and second Peltier-type temperature control units 20 and 30 but also the heater-type temperature control unit 40. This means that the closed-space 14 that surrounds the first and second Peltier-type temperature control units 20 and 30 has a smaller amount of containing gas than the closed-space 14 that surrounds not only the first and second Peltier-type temperature control units 20 and 30 but also the heater-type temperature control unit 40. Reduction of the amount of containing gas would be effective to reduce the moisture level quickly.

The above-described frame 13 including the first and second frames 131 and 132 may be applicable to the temperature control apparatus 10 described in the foregoing embodiments.

Sixth Embodiment

Figure 12:
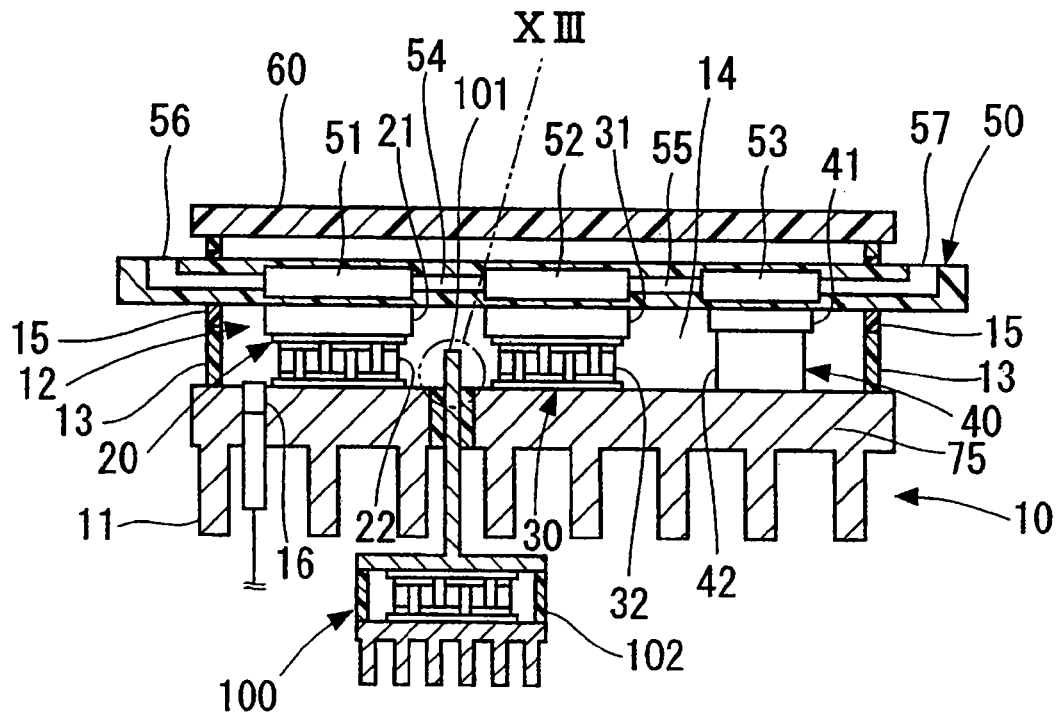
FIG. 12 is a cross sectional elevation view illustrating a temperature control apparatus on which a microchip is mounted in accordance with a sixth embodiment of the present invention.
Figure 13:
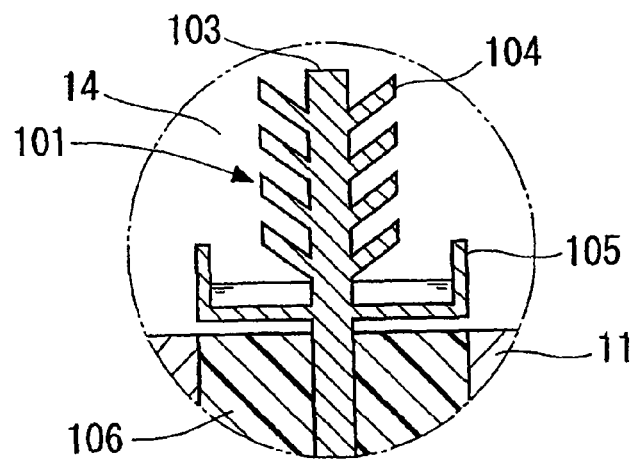
FIG. 13 is a fragmentary enlarged cross sectional elevation view illustrating a part of the temperature control apparatus encompassed by a XIII line of FIG. 12.

FIG. 12 is a cross sectional elevation view illustrating a temperature control apparatus on which a microchip is mounded in accordance with a sixth embodiment of the present invention. FIG. 13 is a fragmentary enlarged cross sectional elevation view illustrating a part of the temperature control apparatus encompassed by a XIII line of FIG. 12.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first second and third reactors 51, 52 and 53 may be regarded as temperature controlled portions. The microchip 50 of the sixth embodiment is the same in structure as the microchip of the first embodiment.

The temperature control apparatus 10 may include, but is not limited to, the heat sink 11, the temperature control unit 12, and the frame 13. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the sixth embodiment are the same in structure as those of the first embodiment.

The frame 13 is disposed between the microchip 50 and the heat sink 11. The frame 13 may extend to surround or encompass the temperature control unit 12 that includes the first and second Peltier-type temperature control units 20 and 30 and the heater-type temperature control unit 40. The frame 13 may perform as a non-empty spacer to provide a closed-space 14 that is defined by the frame 13 and between the microchip

50 and the heat sink 11. The frame 13 of the sixth embodiment is the same as the frame 13 of the first embodiment.

The cover 60 may optionally be provided which covers the microchip 50. The cover 60 of the sixth embodiment is the same as the cover 60 of the first embodiment.

The following descriptions will focus on differences of the sixth embodiment from the first embodiment.

The temperature control unit 10 may include a dehumidifier 100 that is configured to dehumidify the closed-space 14. The dehumidifier 100 of the sixth embodiment is different from the dehumidifier 70 of the first embodiment. The dehumidifier 100 may include, but is not limited to, an endothermic reacting portion 101 and a cooling unit 102. The endothermic reacting portion 101 extends from the cooling unit 102 so as to penetrate the heat sink 11 and project into the closed-space 14.

As shown in FIG. 13, the endothermic reacting portion 101 may further include, but is not limited to, a post 103, a plurality of fins 104 and a water reservoir 105. The post 103 extends from the cooling unit 102 and penetrates the heat sink 11. The post 103 has first and second portions opposing each other. The first portion is connected with the cooling unit 102. The second portion extends to and projects into the closed-space 14. The plurality of fins 104 extends radially from the second portion of the post 103. The water reservoir 105 is disposed around the post 103 and under the plurality of fins 104. The endothermic reacting portion 101 is configured to have a high heat conductivity. The endothermic reacting portion 101 may be made of a material that has a high heat conductivity such as a metal having a high heat conductivity.

The cooling unit 102 is disposed outside of the heat sink 11. The cooling unit 92 may be configured to maintain the post 103 and the plurality of fins 104 to be lower than a predetermined temperature. The cooling unit 102 may be realized not only by the Peltier-type temperature control unit but also other cooling device that utilizes a refrigeration cycle such as a heat pump.

A sealing member 106 may optionally disposed between the post 103 and the heat sink 11. The sealing member 106 thermally separates the post 103 and the plurality of fins 104. The sealing member 106 tightly seals the closed-space 14.

In order to securely prevent the moisture condensation, the humidity of the closed-space 14 is so controlled that the dew point of the atmosphere in the closed-space 14 is preferably lower by 3° C. and more preferably lower by 5° C. than the lower limit of the controllable temperature range of the first and second Peltier-type temperature control units 20 and 30.

The cooling unit 92 may be configured to cool the first portion of the post 103. The post 103 and the plurality of fins 104 are highly heat-conductive. Thus, the post 103 and the plurality of fins 104 are cooled by the cooling unit 102. The second portion of the post 103 and the plurality of fins 104 extend in the closed-space 14. Cooing the second portion of the post 103 and the plurality of fins 104 causes moisture condensation on the surfaces of the second portion of the post 103 and the plurality of fins 104, thereby forming water drops thereon. The water drops are flown downwardly and introduced into the water-reservoir 105.

The cooling unit 102 may be configured to cool the endothermic reacting portion 101 at a temperature lower than the lower limit of the controllable temperature range of the first and second Peltier-type temperature control units 20 and 30. Thus, the moisture condensation is caused on the exposed surfaces of the second portion of the post 103 and the plurality of the fins 104, while substantially no moisture condensation is caused on the exposed surfaces of the first and second Peltier-type temperature control units 20 and 30. Namely, cooling the second portion of the post 103 and the plurality of the fins 104 at the temperature lower than the lower limit of the controllable temperature range of the first and second Peltier-type temperature control units 20 and 30 will prevent the moisture condensation to appear on the exposed surfaces of the first and second Peltier-type temperature control units 20 and 30. No appearance of moisture condensation may prevent the first and second Peltier-type temperature control units 20 and 30 from being broken.

In order to securely prevent the moisture condensation, the humidity of the closed-space 14 is so controlled that the dew point of the atmosphere in the closed-space 14 is preferably lower by 3° C. and more preferably lower by 5° C. than the lower limit of the controllable temperature range of the first and second Peltier-type temperature control units 20 and 30.

It is possible as a modification for the dehumidifier 100 to have the post 103 penetrate through the frame 13 but not through the heat sink 11.

Seventh Embodiment

Figure 14:
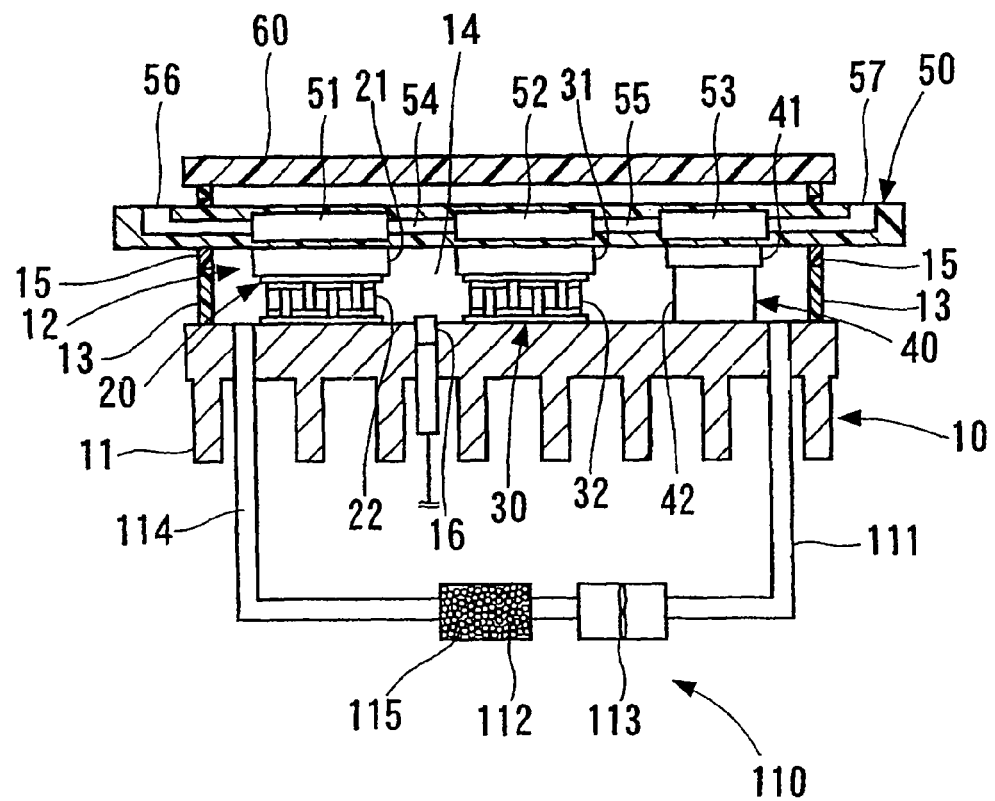
FIG. 14 is a cross sectional elevation view illustrating a temperature control apparatus on which a microchip is mounted in accordance with a seventh embodiment of the present invention.

FIG. 14 is a cross sectional elevation view illustrating a temperature control apparatus on which a microchip is mounded in accordance with a seventh embodiment of the present invention.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first second and third reactors 51, 52 and 53 may be regarded as temperature controlled portions. The microchip 50 of the seventh embodiment is the same in structure as the microchip of the first embodiment.

The temperature control apparatus 10 may include, but is not limited to, the heat sink 11, the temperature control unit 12, and the frame 13. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the seventh embodiment are the same in structure as those of the first embodiment.

The frame 13 is disposed between the microchip 50 and the heat sink 11. The frame 13 may extend to surround or encompass the temperature control unit 12 that includes the first and second Peltier-type temperature control units 20 and 30 and the heater-type temperature control unit 40. The frame 13 may perform as a non-empty spacer to provide a closed-space 14 that is defined by the frame 13 and between the microchip 50 and the heat sink 11. The frame 13 of the seventh embodiment is the same as the frame 13 of the first embodiment.

The cover 60 may optionally be provided which covers the microchip 50. The cover 60 of the seventh embodiment is the same as the cover 60 of the first embodiment.

The following descriptions will focus on differences of the seventh embodiment from the first embodiment.

The temperature control unit 10 may include a dehumidifier 110 that is configured to dehumidify the closed-space 14. The dehumidifier 110 of the seventh embodiment is different from the dehumidifier 70 of the first embodiment. The dehumidifier 110 may include, but is not limited to, a gas circulation passage member 111, a moisture absorber 112, and a circulation pump 113.

The gas circulation passage member 111 may be configured to extend through the heat sink 11 so that the gas circulation passage member 111 communicates with the closed-space 14. The gas circulation passage member 111 has first and second ends opposing each other. The first and second ends of the gas circulation passage member 111 communicate with the closed-space 14. The gas in the closed-space 14 is circulated through the gas circulation passage member 111. The gas circulation passage member 111 may be configured to provide a gas circulation passage 114 that communicates with the closed-space 14. The gas in the closed-space 14 is circulated through the gas circulation passage 114.

The moisture absorber 112 may be disposed on the gas circulation passage 114. The moisture absorber 112 may be configured to absorb moisture of a circulating gas flowing through the gas circulation passage 114. The moisture absorber 112 may be realized by, but not limited to, one or more absorbent 115. Typical examples of the absorbent may include, but are not limited to, silica gel, calcium oxide, and calcium chloride.

The circulation pump 113 may be disposed on the gas circulation passage 114. The circulation pump 113 may be configured to be operated to form or generate a circulation flow of the gas through the gas circulation passage 114 and the closed-space 14.

After the microchip 50 is mounted on the temperature control apparatus 10, the controller that is not illustrated operates the circulation pump 113 to form the circulation flow of the gas through the gas circulation passage 114 and the closed-space 14. Namely, the gas in the closed-space 14 is circulated through the gas circulation passage 114. The circulating gas flows through the moisture absorber 112, in which the moisture of the circulation gas is absorbed by the absorbent 115 of the moisture absorber 112. In other words, the circulating gas is humidified by the moisture absorber 112. The humidified gas is then supplied to the closed-space 14, thereby reducing the moisture level of the gas in the closed-space 14. The dehumidifier 110 maintains the gas in the closed-space 14 to have a lower moisture level as to prevent appearance of moisture condensation on the exposed surfaces of the first and second Peltier-type temperature control units 20 and 30. Preventing the appearance of moisture condensation prevents the first and second Peltier-type temperature control units 20 and 30 from being broken.

If the silica gal is used as the absorbent 115 filled in the moisture absorber 112, the moisture absorber 112 is heated when the microchip 50 is replaced and the closed-space 14 is made into an open-space. Heating the moisture absorber 112 heats the silica gal as the absorbent 115, thereby causing moisture desorption or moisture elimination from the heated absorbent 115. The eliminated moisture is exhausted or discharged from the open-space to the outside atmosphere. The moisture elimination or moisture desorption allows using the absorbent 115 again.

It is also possible as a modification to further provide the gas supply unit 97 and the fourth valve 98, both of which have been described with reference to FIG. 9.

The gas supply unit 97 may be configured to contain or reserve the circulating gas that has been dehumidified by the moisture absorber 112. The gas supply unit 97 may be disposed on the gas circulation passage 114 and downstream of the moisture absorber 112. The fourth valve 98 may be disposed downstream with reference to the gas supply unit 97. The dehumidified gas is then supplied from the gas supply unit 97 to the closed-space 14, while the fourth valve 98 remains open.

Eighth Embodiment

Figure 15:
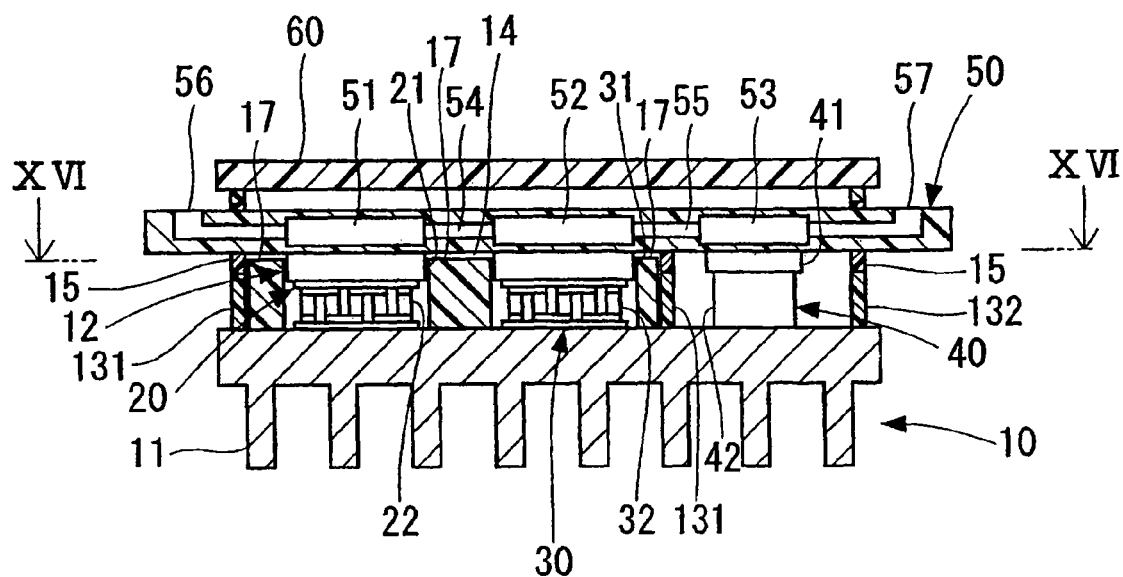
FIG. 15 is a cross sectional elevation view illustrating a temperature control apparatus on which a microchip is mounted in accordance with an eighth embodiment of the present invention.
Figure 16:
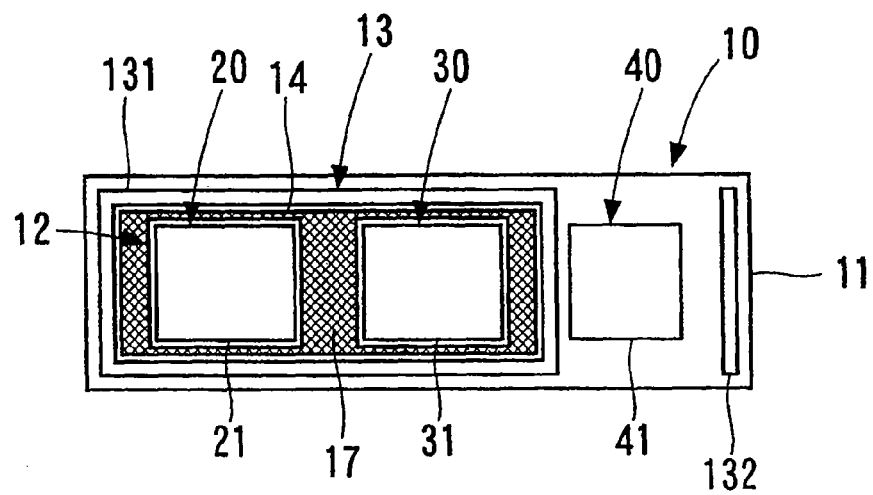
FIG. 16 is a cross sectional horizontal view illustrating the temperature control apparatus, taken along a XVI-XVI line of FIG. 15.

FIG. 15 is a cross sectional elevation view illustrating a temperature control apparatus on which a microchip is mounded in accordance with an eighth embodiment of the present invention. FIG. 16 is a cross sectional horizontal view illustrating the temperature control apparatus, taken along a XVI-XVI line of FIG. 15.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first second and third reactors 51, 52 and 53 may be regarded as temperature controlled portions. The microchip 50 of the eighth embodiment is the same in structure as the microchip of the first embodiment.

The temperature control apparatus 10 may include, but is not limited to, the heat sink 11, the temperature control unit 12, and the frame 13. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the eighth embodiment are the same in structure as those of the first embodiment.

The cover 60 may optionally be provided which covers the microchip 50. The cover 60 of the eighth embodiment is the same as the cover 60 of the first embodiment.

The following descriptions will focus on differences of the eighth embodiment from the first embodiment.

The temperature control apparatus 10 of the eighth embodiment is free of the dehumidifier 70 that is included in the temperature control apparatus 10 of the first embodiment.

The frame 13 is disposed between the microchip 50 and the heat sink 11. The frame 13 of the eighth embodiment is different from the frame 13 of the first embodiment. The frame 13 may further include a first frame portion 131 and a second frame portion 132. The first frame portion 131 may extend to partially surround or encompass the temperature control unit 12 that includes the first and second Peltier-type temperature control units 20 and 30. For example, the first frame portion 131 may be configured to surround or encompass the first and second Peltier-type temperature control units 20 and 30. The first frame portion 131 may be configured not to surround or encompass the heater-type temperature control unit 40. The first frame portion 131 may perform as a first non-empty spacer to provide a first closed-space 14 that is defined by the first frame portion 131 and between the microchip 50 and the heat sink 11. The first closed-space 14 of the eighth embodiment contains only the first and second Peltier-type temperature control units 20 and 30 but does not contain the heater-type temperature control unit 40.

The second frame portion 132 may extend outside of the heater-type temperature control unit 40. The second frame portion 132 does not surround or encompass the heater-type temperature control unit 40 so that the heater-type temperature control unit 40 is disposed between the first and second frame portions 131 and 132. The heater-type temperature control unit 40 is exposed to the outside space of the temperature control apparatus 10. The second frame portion 132 may support the side portion of the microchip 50. The heater-type temperature control unit 40 may be configured to heat the third reactor 53 but not to cool the third reactor 53. The heater-type temperature control unit 40 is free from the problem with the moisture condensation on the exposed surface thereof. Thus, it is unnecessary to dehumidify the gas or atmosphere around the heater-type temperature control unit 40. This means that it is unnecessary to dispose the heater-type temperature control unit 40 in the closed-space 14.

The first and second Peltier-type temperature control units 20 and 30 may be configured to show a temperature drop to a lower temperature than room temperature. When the first and second Peltier-type temperature control units 20 and 30 have a lower temperature than room temperature, the moisture condensation is caused on the exposed surfaces of the first and second Peltier-type temperature control units 20 and 30. Thus, it is preferable that at least the first and second Peltier-type temperature control units 20 and 30 are disposed in the closed-space 14. The moisture level of the closed-space is maintained lower than the predetermined level, while the first and second Peltier-type temperature control units 20 and 30 are operated.

The closed-space 14 that surrounds the first and second Peltier-type temperature control units 20 and 30 has a smaller volume than the closed-space 14 that surrounds not only the first and second Peltier-type temperature control units 20 and 30 but also the heater-type temperature control unit 40. This means that the closed-space 14 that surrounds the first and second Peltier-type temperature control units 20 and 30 has a smaller amount of containing gas than the closed-space 14 that surrounds not only the first and second Peltier-type temperature control units 20 and 30 but also the heater-type temperature control unit 40. Reduction of the amount of containing gas would be effective to reduce the moisture level quickly.

In addition, the temperature control apparatus 10 may further include a filler 17 that fills the majority of the closed-space 14, thereby reducing the volume of a gas-containing space included in the closed-space 14. In other words, the filler 17 filling the majority of the closed-space 14 greatly reduces the volume of the gas in the closed-space 14. The filler 17 filling the majority of the closed-space 14 greatly reduces the moisture amount of the gas in the closed-space 14. The reduction of the moisture amount of the gas in the closed-space 14 allows rapid dehumidification of the gas in the closed-space 14. The reduction of the moisture amount of the gas in the closed-space 14 also reduces the moisture condensation to appear on the exposed surfaces of the first and second Peltier-type temperature control units 20 and 30.

The filler 17 may be made of, but not limited to, a material having a low heat conductivity. Typical examples of the material for the filler 17 may include, but are not limited to, ceramics such as alumina and resins such as epoxy resins and silicone.

Ninth Embodiment

Figure 17:
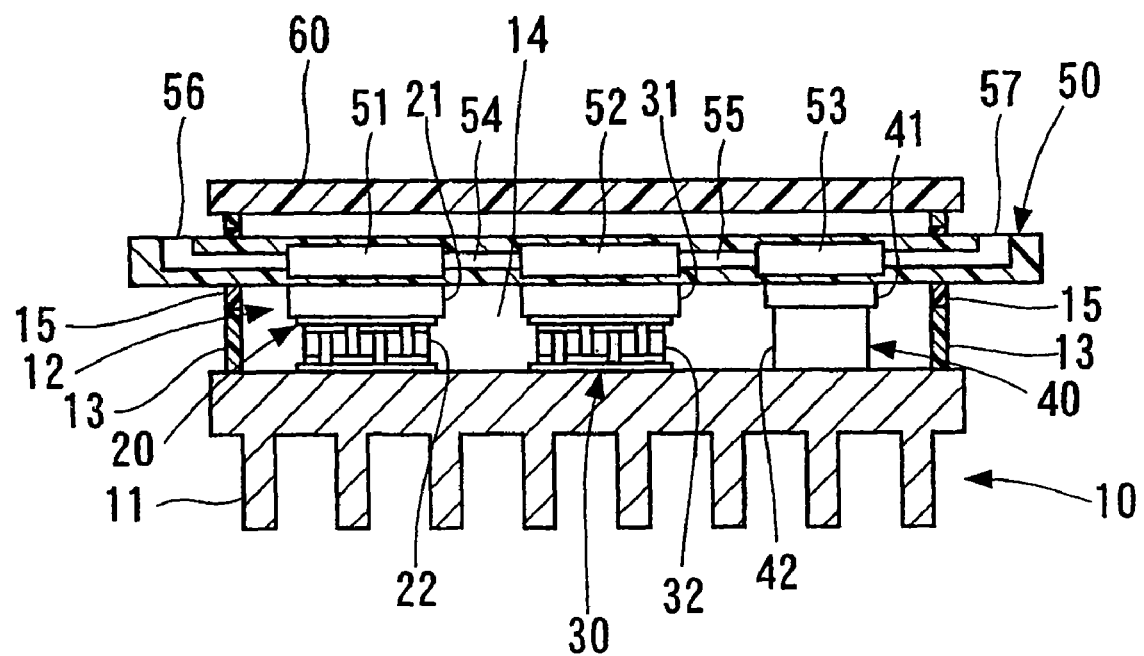
FIG. 17 is a cross sectional elevation view illustrating a temperature control apparatus on which a microchip is mounted in accordance with a ninth embodiment of the present invention.

FIG. 17 is a cross sectional elevation view illustrating a temperature control apparatus on which a microchip is mounded in accordance with a ninth embodiment of the present invention.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first second and third reactors 51, 52 and 53 may be regarded as temperature controlled portions. The microchip 50 of the ninth embodiment is the same in structure as the microchip of the first embodiment.

The temperature control apparatus 10 may include, but is not limited to, the heat sink 11, the temperature control unit 12, and the frame 13. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the ninth embodiment are the same in structure as those of the first embodiment.

The cover 60 may optionally be provided which covers the microchip 50. The cover 60 of the ninth embodiment is the same as the cover 60 of the first embodiment.

The following descriptions will focus on differences of the ninth embodiment from the first embodiment.

The temperature control apparatus 10 of the ninth embodiment is free of the dehumidifier 70 and the humidity sensor 16 that are included in the temperature control apparatus 10 of the first embodiment.

The frame 13 of the ninth embodiment is the same as the first embodiment. Namely, the frame 13 is disposed between the microchip 50 and the heat sink 11. The frame 13 may be configured to surround and encompass the first and second Peltier-type temperature control units 20 and 30 and the heater-type temperature control unit 40. Namely, the first and second Peltier-type temperature control units 20 and 30 are disposed in the limited closed-space 14 that has the limited amount of moisture of the gas that is confined in the limited closed-space 14. The confinement of the first and second Peltier-type temperature control units 20 and 30 in the limited closed-space 14 limits the moisture condensation appearing on the exposed surfaces of the first and second Peltier-type temperature control units 20 and 30. Limitation to the moisture condensation may contribute to prevent the first and second Peltier-type temperature control units 20 and 30 from being broken.

Tenth Embodiment

Figure 18:
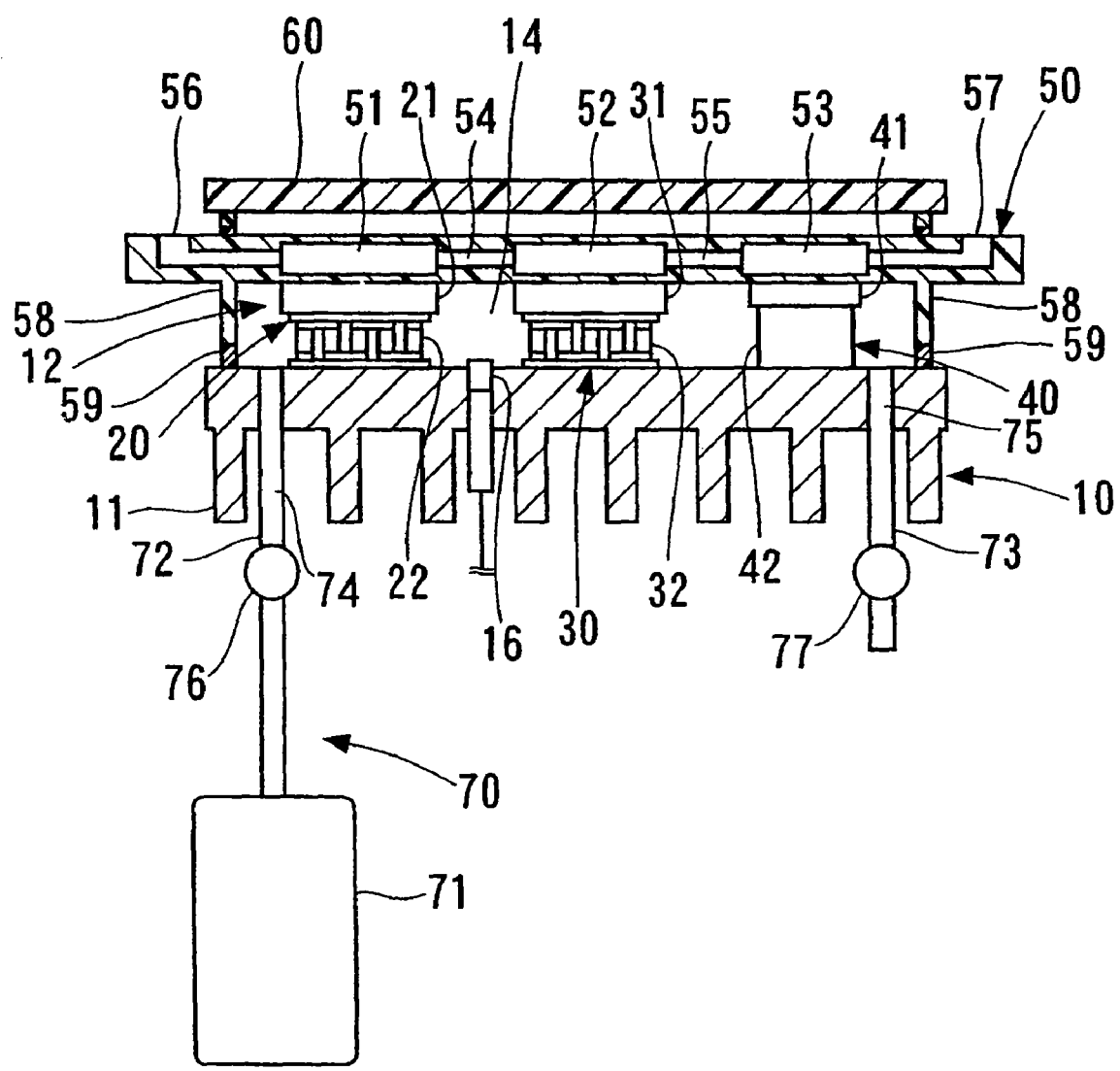
FIG. 18 is a cross sectional elevation view illustrating a temperature control apparatus on which a microchip is mounted in accordance with a tenth embodiment of the present invention.

FIG. 18 is a cross sectional elevation view illustrating a temperature control apparatus on which a microchip is mounded in accordance with a tenth embodiment of the present invention.

The temperature control apparatus 10 is configured to allow a microchip 50 to be removably mounted thereon. The temperature control apparatus 10 may include, but is not limited to, the heat sink 11, the temperature control unit 12, and the frame 58. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the tenth embodiment are the same in structure as those of the first embodiment.

The cover 60 may optionally be provided which covers the microchip 50. The cover 60 of the tenth embodiment is the same as the cover 60 of the first embodiment.

The temperature control apparatus 10 of the tenth embodiment also has the dehumidifier 70 that has been described with reference to FIG. 1 in the first embodiment.

The following descriptions will focus on differences of the tenth embodiment from the first embodiment.

The microchip 50 may include, but is not limited to, first, second and third reactors 51, 52, and 53, first and second paths 54 and 55, an inlet port 56 and an outlet port 57 as well as a frame 58. The first, second and third reactors 51, 52 and 53 are subject to temperature control by the temperature control apparatus 10. Thus, the first second and third reactors 51, 52 and 53 may be regarded as temperature controlled portions. The frame 58 may be configured to extend from the first surface of the microchip 50. The microchip 50 of the tenth embodiment is different from the microchip 50 of the first embodiment.

The microchip 50 has the frame 58 that is disposed between the microchip 50 and the heat sink 11. The frame 58 of the tenth embodiment is different from the frame 58 of the first embodiment. The frame 58 may be configured to surround or encompass the first and second Peltier-type temperature control units 20 and 30 and the heater-type temperature control unit 40. When the microchip 50 is mounted on the temperature control apparatus 10, the frame 58 is disposed between the microchip 50 and the heat sink 11. The frame 58 may be secured or attached to the second surface of the microchip 50. The frame 58 may be configured to extend from the second surface of the microchip 50.

A sealing member 59 can be provided between the frame 58 and the heat sink 11. The frame 58 may have first and second sides opposing each other. The first side of the frame 58 is in contact with the sealing member 59. The second side of the frame 58 is in contact with or is united with the first surface of the microchip 50.

The sealing member 59 may be made of an elastic and deformable heat-insulating material such as a foamed rubber or a silicone resin. When the microchip 50 is mounted on the temperature control apparatus 10, the sealing member 59 is made into contact tightly with the first surface of the microchip 50 and the second surface of the frame 58 so as to highly seal the closed-space 14. Further, the sealing member 59 may be deformed so that the first and second Peltier-type temperature control units 20 and 30 and the heater-type temperature control unit 40 are in contact with the first surface of the microchip 50 and closely adjacent to the first, second and third reactors 51, 52 and 53, respectively.

It is possible as a modification for the sealing member 59 to be fixed to the first surface of the microchip 50. In this case, the sealing member 59 may be bonded to the first surface of the microchip 50.

It is also possible as a further modification for the sealing member 59 to be provided on each of the heat sink 11 and the first side of the frame 58.

The sealing member 59 may preferably have a highly heat-insulating property that reduces the heat conduction between the microchip 50 and the frame 58. Namely, the sealing member 59 and the frame 58 both having the highly heat-insulating properties may reduce the heat transfer between the heat sink 11 and the microchip 50. The frame 58 may preferably be shaped in a thin plate that provides a mechanical strength sufficient to support the microchip 50. The thin thickness of the frame 58 reduces a horizontal section area thereof. The reduction in the horizontal section area of the frame 58 may contribute to reduce the heat transfer between the heat sink 11 and the microchip 50. The reduction in the heat transfer between the heat sink 11 and the microchip 50 may also contribute to reduce the power consumption by the first and second Peltier modules 22 and 32.

As described above, the frame 58 may be provided on the microchip 50. The sealing member 59 may be provided between the frame 58 and the heat sink 11. The sealing member 59 may be configured to tightly seal the closed-space 14.

The frame 58 may be configured to be united with the first surface of the microchip 50. In other words, the frame 58 may be formed as a portion of the microchip 50. Alternatively, the frame 58 may be configured to be a discrete part from the microchip 50. The frame 58 may be in contact tightly with the first surface of the microchip 50. In this case, the frame 58 may be adhered to the first surface of the microchip 50 by using an adhesive agent. The frame 58 may also be welded to the first surface of the microchip 50 by using an adhesive agent. It is also preferable to further provide an additional sealing member between the discrete frame 58 and the first surface of the microchip 50 in addition to the sealing member 59.

Eleventh Embodiment

Figure 19:
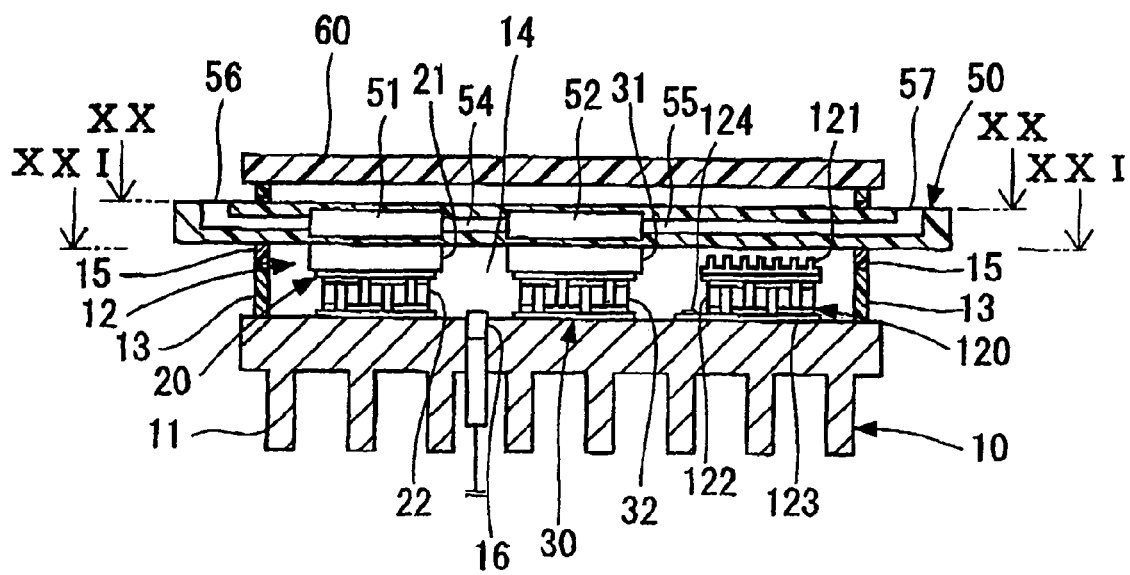
FIG. 19 is a cross sectional elevation view illustrating a temperature control apparatus on which a microchip is mounted in accordance with an eleventh embodiment of the present invention.
Figure 20:
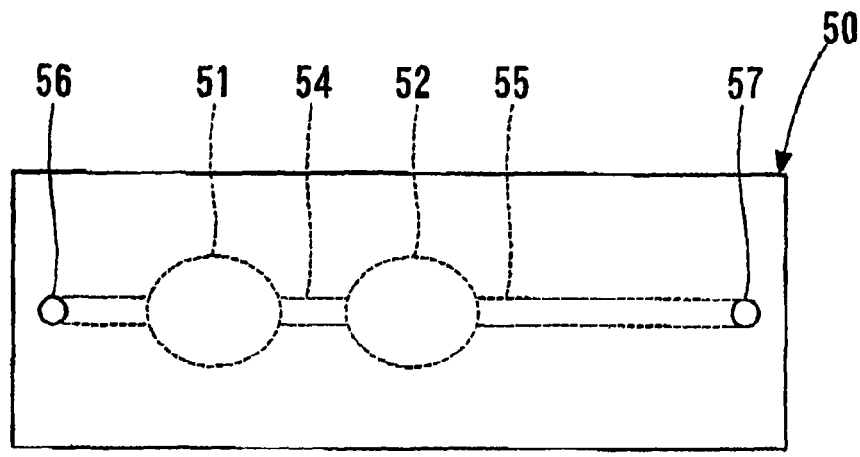
FIG. 20 is a cross sectional horizontal view illustrating the microchip, taken along a XX-XX line of FIG. 19.
Figure 21:
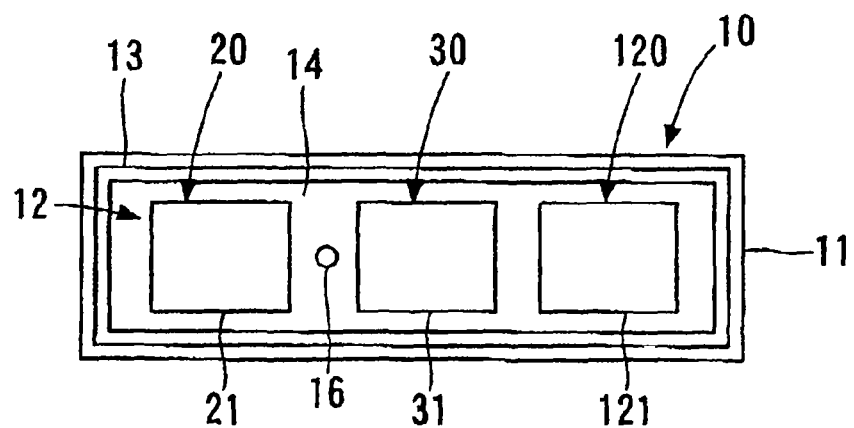
FIG. 21 is a cross sectional horizontal view illustrating the temperature control apparatus, taken along a XXI-XXI line of FIG. 19.
Figure 22:
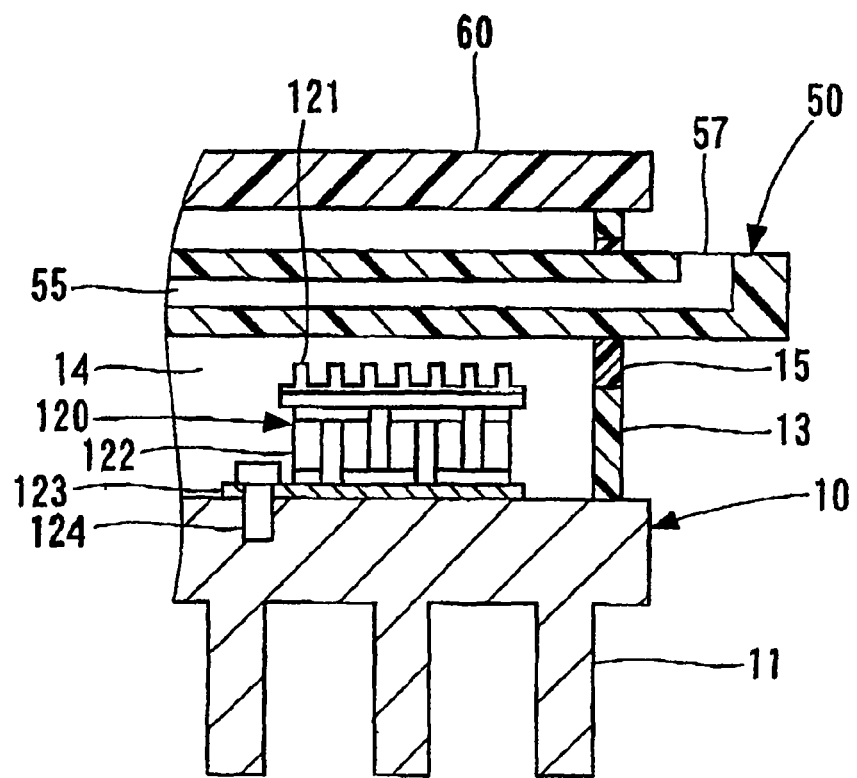
FIG. 22 is a fragmentary enlarged cross sectional elevation view illustrating a part of the temperature control apparatus shown in FIG. 19.

FIG. 19 is a cross sectional elevation view illustrating a temperature control apparatus on which a microchip is mounted in accordance with an eleventh embodiment of the present invention. FIG. 20 is a cross sectional horizontal view illustrating the microchip, taken along a XX-XX line of FIG. 19. FIG. 21 is a cross sectional horizontal view illustrating the temperature control apparatus, taken along a XXI-XXI line of FIG. 19. FIG. 22 is a fragmentary enlarged cross sectional elevation view illustrating a part of the temperature control apparatus shown in FIG. 19.

The following descriptions will focus on differences of the eleventh embodiment from the first embodiment.

The temperature control apparatus 10 is configured to allow a microchip 50 to be removably mounted thereon. The microchip 50 may include, but is not limited to, first and second reactors 51 and 52, first and second paths 54 and 55, an inlet port 56 and an outlet port 57. The first and second reactors 51 and 52 are subject to temperature control by the temperature control apparatus 10. Thus, the first and second reactors 51 and 52 may be regarded as temperature controlled portions. The first and second reactors 51 and 52 are communicated with each other through the first path 54. The second reactor 52 and the outlet port 57 are communicated with each other through the second path 55. The microchip 50 of the eleventh embodiment is different in structure from the microchip 50 of the first embodiment.

The temperature control apparatus 10 may include, but is not limited to, the heat sink 11, the temperature control unit 12, and the frame 13. A cover 60 may optionally be provided which covers the microchip 50. The cover 60 of the eleventh embodiment is the same as the cover 60 of the first embodiment. The temperature control unit 12 is configured to control temperatures of the first and second reactors 51 and 52 of the microchip 50.

The heat sink 11 may optionally have a humidity sensor 16 that is configured to sense or detect a humidity of the closed-space 14 and generate a humidity signal that represents the detected humidity. The humidity sensor 16 of the eleventh embodiment is the same as the humidity sensor 16 of the first embodiment.

The temperature control apparatus 10 of the eleventh embodiment is free of the dehumidifier 70 that is included in the temperature control apparatus 10 of the first embodiment.

The temperature control unit 12 may include, but is not limited to, the first and second Peltier-type temperature control units 20 and 30 and a cold dehumidifier 120. The first and second Peltier-type temperature control units 20 and 30 may be configured to control the first and second temperatures of the first and second reactors 51 and 52 as the first and second temperature controlled portions of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed separately from the first surface of the microchip 50. The first and second Peltier-type temperature control units 20 and 30 of the eleventh embodiment are the same in structure as those of the first embodiment.

The frame 13 of the eleventh embodiment is the same as the first embodiment. Namely, the frame 13 is disposed between the microchip 50 and the heat sink 11. The frame 13 may be configured to surround and encompass the first and second Peltier-type temperature control units 20 and 30 and the cold dehumidifier 120.

The cold dehumidifier 120 may be configured to dehumidify the closed-space 14. The cold dehumidifier 120 may include, but is not limited to, a heat radiator 121, a third Peltier module 122, and a base 123. The base 123 may be configured to be removably mounted on the surface of the heat sink 11. The third Peltier module 122 may be disposed on the base 123. The heat radiator 121 may be disposed on the third Peltier module 122.

The heat radiator 121 may be configured to perform a heat radiation. The heat radiator 121 may be made of a material that has high heat conductivity. Typical examples of the heat conductive material for the heat radiator 121 may include, but are not limited to, metals such as aluminum and copper, a variety of alloys, heat conductive ceramics and heat conductive resins.

The cold dehumidifier 120 may optionally include a temperature detecting unit that is configured to detect the temperature of the heat radiator 121. The temperature detecting unit may be realized by, but not limited to, a thermister, a thermocouple, or a platinum resistance. The temperature detecting unit is configured to detect the temperature of the heat radiator 121 and generate a third temperature signal that represents the detected temperature of the heat radiator 121. The temperature detecting unit is configured to supply the third temperature signal to the controller that is not illustrated.

The third Peltier module 122 may be disposed on the base 123. The heat radiator 121 may be disposed on the third Peltier module 122. The cold dehumidifier 120 is spatially separated from the microchip 50. The heat radiator 121 is spatially separated from the microchip 50. The heat radiator 121 may be bonded to the third Peltier module 122 by using the adhesive agent and the solder.

An application of a current to the third Peltier module 122 causes a heat generation reaction at the first side and an endothermic reaction at the second side thereof.

The cold dehumidifier 120 is configured so that when the microchip 50 is amounted on the temperature control apparatus 10, the cold dehumidifier 120 is distanced by a gap from the first surface of the microchip 50. In other words, the when the microchip 50 is amounted on the temperature control apparatus 10, the heat radiator 121 is distanced by a gap from the first surface of the microchip 50. The temperature of the microchip 50 is free from a substantive influence of the cold dehumidifier 120. The microchip 50 is free of any reactor that is closely adjacent to the cold dehumidifier 120.

The cold dehumidifier 120 may be maintained at a lower temperature than those of the first and second Peltier-type temperature control units 20 and 30. After the microchip 50 is mounted on the temperature control apparatus 10 thereby forming the closed-space 14, the cold dehumidifier 120 may be controlled to the lower temperature before the first and second Peltier-type temperature control units 20 and 30 are controlled. In other words, the cold dehumidifier 120 may be controlled to the lower temperature, while the first and second Peltier-type temperature control units 20 and 30 are not performed. A moisture condensation is caused on the exposed surface of the cold dehumidifier 120, while almost no moisture condensation appears on the exposed surfaces of the first and second Peltier-type temperature control units 20 and 30. The moisture contained in the gas or atmosphere in the closed-space 14 is likely to be condensed on the exposed surface of the cold dehumidifier 120. The moisture condensation on the exposed surface of the cold dehumidifier 120 reduces the moisture level of the gas or atmosphere in the closed-space 14.

After the moisture condensation is caused on the exposed surface of the cold dehumidifier 120, the first and second Peltier-type temperature control units 20 and 30 are operated to control the first and second temperatures of the first and second reactors 51 and 52 of the microchip 50. This may reduce or prevent the moisture condensations on the exposed surfaces of the first and second Peltier-type temperature control units 20 and 30, thereby preventing the first and second Peltier-type temperature control units 20 and 30 from being broken.

It is preferable to evaporate the condensed moisture from the exposed surface of the cold dehumidifier 120 while the closed-space 14 is made into an open-space after the temperature control process for the microchip 50 has been completed and the microchip 50 has been removed from the temperature control apparatus 10.

The moisture condensation may be caused mainly on the exposed surface of the heat radiator 121. It is thus preferable to evaporate the condensed moisture from the exposed surface of the heat radiator 121 while the closed-space 14 is made into an open-space after the temperature control process for the microchip 50 has been completed and the microchip 50 has been removed from the temperature control apparatus 10. Evaporation of the condensed moisture from the exposed surface of the heat radiator 121 can be realized by heating the heat radiator 121.

The base 123 may be configured to be removably attached to the heat sink 11. The base 123 may be realized by, but not limited to, a ridged member or a ridged part, for example, a metal plate such as an aluminum plate. The third Peltier module 122 may be bonded to the base 123 by using the adhesive agent and the solder. The base 123 may be removably fastened to the heat sink 11 by a removable fastener 124. A typical example of the removable fastener 124 may include, but is not limited to, one ore more bolts. The base 123 may be removable from the heat sink 11 by removing the removable fastener 124. The removable fastener 124 is configured to removably fasten the base 123 to the heat sink 11 so that the cold dehumidifier 120 is removable and replaceable.

If the base 123 is formed of the ridged member, then the rigidity of the base 123 allows the cold dehumidifier 120 is securely fastened to the heat sink 11. This may prevent the cold dehumidifier 120 from receiving any mechanical damage.

It is possible as a modification for the cold dehumidifier 120 to be free of the base 123. In this case, the third Peltier module 122 is attached directly to the heat sink 11. The third Peltier module 122 may have an alumina substrate that is configured to be attached to the heat sink 11.

The temperature control process is performed by the first and second Peltier-type temperature control units 20 and 30. Prior to the temperature control process, the cold dehumidifier 120 is operated to have a lower temperature than the first and second Peltier-type temperature control units 20 and 30 to cause the moisture condensation on the exposed surface of the cold dehumidifier 120 and avoid any moisture condensation to appear on the exposed surfaces of the first and second Peltier-type temperature control units 20 and 30. The moisture condensation on the exposed surface of the cold dehumidifier 120 reduces the moisture level of the gas or atmosphere in the closed-space 14. This allows that at the reduced moisture level of the gas or atmosphere of the closed-space 14, the first and second Peltier-type temperature control units 20 and 30 be operated to control the first and second temperatures of the first and second reactors 51 and 52 of the microchip 50. This may prevent any moisture condensation from appearing on the exposed surfaces of the first and second Peltier-type temperature control units 20 and 30.

The cold dehumidifier 120 is operated to have the condensed moisture which may cause damage thereto. Once the cold dehumidifier 120 is broken by the moisture condensation, then the broken cold dehumidifier 120 may be replaced by removing the base 123 from the heat sink 11.

Twelfth Embodiment

Figure 23:
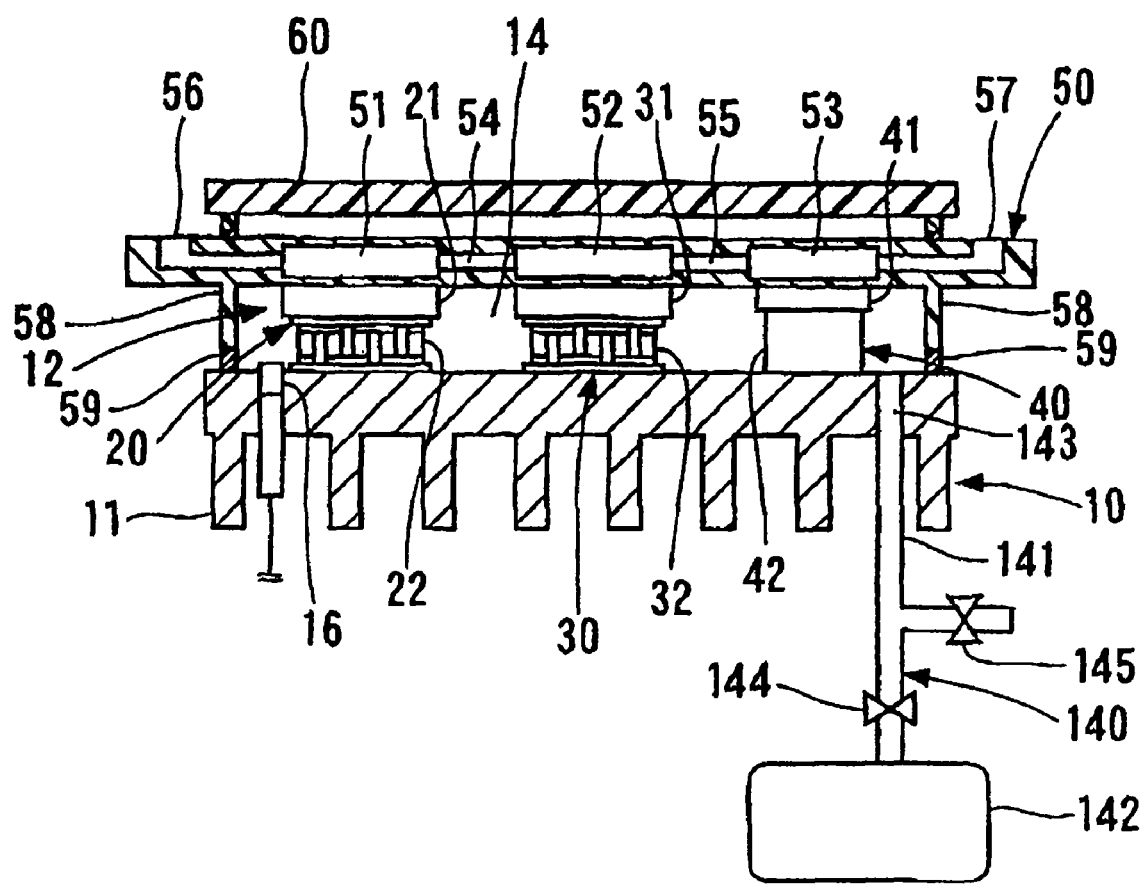
FIG. 23 is a cross sectional elevation view illustrating a temperature control apparatus on which a microchip is mounted in accordance with a twelfth embodiment of the present invention.

FIG. 23 is a cross sectional elevation view illustrating a temperature control apparatus on which a microchip is mounded in accordance with a twelfth embodiment of the present invention.

The temperature control apparatus 10 is configured to allow a microchip 50 to be removably mounted thereon. The microchip 50 may include, but is not limited to, first, second and third reactors 51, 52, and 53, first and second paths 54 and 55, an inlet port 56 and an outlet port 57. The first, second and third reactors 51, 52 and 53 are subject to temperature control by the temperature control apparatus 10. Thus, the first second and third reactors 51, 52 and 53 may be regarded as temperature controlled portions. The microchip 50 of the twelfth embodiment is the same in structure as the microchip of the first embodiment.

The temperature control apparatus 10 may include, but is not limited to, the heat sink 11, the temperature control unit 12, and the frame 13. The temperature control unit 12 is configured to control temperatures of the first, second and third reactors 51, 52, and 53 of the microchip 50. The temperature control unit 12 may include, but is not limited to, the first and second Peltier-type temperature control units 20 and 30 and the heater-type temperature control unit 40. The first and second Peltier-type temperature control units 20 and 30 may be configured to control the first and second temperatures of the first and second reactors 51 and 52 as the first and second temperature controlled portions of the microchip 50. The heater-type temperature control unit 40 may be configured to control the third temperature of the third reactor 53 as the third temperature controlled portion of the microchip 50. The first and second Peltier-type temperature control units 20 and 30 may be disposed closely adjacent to the first and second temperatures of the first and second reactors 51 and 52 as the first and second temperature controlled portions of the microchip 50. The first and second Peltier-type temperature control units 20 and 30 may be disposed in contact with the first surface of the microchip 50. The heater-type temperature control unit 40 may be disposed closely adjacent to the third temperature of the third reactor 53 as the third temperature controlled portion of the microchip 50. The heater-type temperature control unit 40 may be disposed in contact with the first surface of the microchip 50.

The first and second Peltier-type temperature control units 20 and 30 and the heater-type temperature control unit 40 of the twelfth embodiment are the same in structure as those of the first embodiment.

The cover 60 may optionally be provided which covers the microchip 50. The cover 60 of the twelfth embodiment is the same as the cover 60 of the first embodiment.

The frame 13 of the twelfth embodiment is the same as the tenth embodiment. Namely, the frame 13 is disposed between the microchip 50 and the heat sink 11. The frame 13 may be configured to surround and encompass the first and second Peltier-type temperature control units 20 and 30 and the heater-type temperature control unit 40. Namely, the first and second Peltier-type temperature control units 20 and 30 and the heater-type temperature control unit 40 are disposed in the closed-space 14.

The following descriptions will focus on differences of the twelfth embodiment from the first embodiment.

The temperature control apparatus 10 of the twelfth embodiment is free of the dehumidifier 70 and the humidity sensor 16 that are included in the temperature control apparatus 10 of the first embodiment.

The temperature control apparatus 10 of the twelfth embodiment may further include a depressurizing unit 140 that is configured to depressurize the closed-space 14. The depressurizing unit 130 may include, but is not limited to, a gas passage member 141, and a depressurizing device 142. The gas passage member 141 may extend through or penetrate the heat sink 11, so that the third gas passage member 81 communicates between the closed-space 14 and the depressurizing device 142. The gas passage member 141 can be configured to provide a gas passage 143 that communicates between the closed-space 14 and the depressurizing device 142. A first valve 144 may be provided on the gas passage member 141. The first valve 144 may be configured to open and close the gas passage 143.

The depressurizing device 142 may be realized by, but not limited to, a depressurizing pump. The depressurizing pump 142 is configured to depressurize the closed-space 14, while the first valve 144 remains opened. A leak passage member with a second valve 145 is provided. The leak passage member is configured to communicate with the gas passage member 141. The second valve 145 may be configured to open and close the gas passage 143. The depressurizing pump 142 is operated to depressurize the closed-space 14, while the first valve 144 remains opened and the second valve 145 remains closed.

After the temperature control process has been completed, then the second valve is opened while the first valve remains closed so that the reduced pressure of the closed-space 14 becomes the atmospheric pressure.

After the microchip 50 is mounted on the temperature control apparatus 10, the depressurizing device 140 is oper-ated to depressurize the closed-space 14, while the first valve 144 remains opened and the second valve 145 remains closed. When the pressure of the closed-space 14 reaches a predetermined pressure level that is lower than the atmospheric pressure, then the operation of the depressurizing device 140 is discontinued and the first valve 144 is closed. Then, the first and second Peltier-type temperature control units 20 and 30 are performed to control the first and second temperatures of the first and second reactors 51 and 52 of the microchip 50.

The pressure drop of the closed-space 14 may cause the atmospheric pressure to be applied to the microchip 50 from the outside toward the heat sink 11 so that the first surface of the microchip 50 is in contact tightly with the first and second Peltier-type temperature control units 20 and 30 and the heater-type temperature control unit 40.

Before the temperature control process is carried out, the depressurizing device 140 is operated to depressurize the closed-space 14. The first and second Peltier-type temperature control units 20 and 30 are operated to perform the temperature control processes in the depressurized closed-space 14. The depressurized closed-space 14 has a lower pressure than the atmospheric pressure. The depressurizing process reduces the amount of a gas or atmosphere confined in the closed-space 14, thereby reducing the amount of moisture contained in the closed-space 14. The reduction of moisture contained in the closed-space 14 may reduce the moisture condensation that will appear on the exposed surfaces of the first and second Peltier-type temperature control units 20 and 30 that are being operated. The reduction of moisture contained in the closed-space 14 may prevent the moisture condensation from appearing on the exposed surfaces of the first and second Peltier-type temperature control units 20 and 30 that are being operated. This may prevent the first and second Peltier-type temperature control units 20 and 30 from being broken.

The depressurizing device 140 is operated to depressurize the closed-space 14, thereby causing a pressure drop in the closed-space 14. The pressure drop may cause the atmospheric pressure to be applied to the microchip 50 from the outside toward the heat sink 11 so that the first surface of the microchip 50 is in contact tightly with the first and second Peltier-type temperature control units 20 and 30 and the heater-type temperature control unit 40. The tight contact between the microchip 50 and the temperature control unit 12 may allow the first and second Peltier-type temperature control units 20 and 30 and the heater-type temperature control unit 40 to perform precise temperature controls to the first, second and third reactors 51, 52 and 53.

Modifications:

In accordance with the first to seventh embodiments, the temperature sensor 16 is provided in the heat sink 11. It is possible as a modification for the temperature sensor 16 to be provided on or in the frame 13.

In accordance with the first to fifth, seventh, tenth and twelfth embodiments, the gas passage member or members are provided which penetrate the heat sink 11. It is possible as a modification for the gas passage member or members to be provided which penetrate the frame 13 or 58.

In accordance with the second embodiment, the gas passage member for depressurizing the closed-space 14 is provided which penetrates the heat sink 11. It is possible as a modification for the gas passage member to be provided which penetrate the frame 13.

Any combinations of the configurations of the temperature control apparatuses 10 of the foregoing embodiments may be available.

Examples:

Experiments were carried out using the temperature control apparatuses 10 described with reference to FIGS. 1, 7 and 8 in the above-described first, second and third embodiments. For each of the temperature control apparatuses 10 shown in FIGS. 1, 7 and 8, the first Peltier-type temperature control unit 20 was adjusted at a temperature of 20° C. The second Peltier-type temperature control unit 30 was adjusted at a temperature of 10° C. The heater-type temperature control unit 40 was adjusted at a temperature of 40° C. Each of the temperature control apparatuses 10 shown in FIGS. 1, 7 and 8 was disposed in an atmosphere at a temperature of 30° C. and a humidity of 50%. 15.2 g of moisture is contained in 1 m$^3$ of the atmosphere at the temperature of 30° C. and the humidity of 50%.

The microchip 50 was prepared which has dimensions of 24 mm in width, 64 mm in length, and 1 mm in thickness. The microchip 50 was mounted on each of the temperature control apparatuses 10 shown in FIGS. 1, 7 and 8, thereby forming the closed-space 14. The dimensions of the frame 13 were decided so that the closed-space 14 has dimensions of 20 mm in width, 60 mm in length, and 3 mm in height.

The experiments were carried out as follows.

If the temperature is 30° C. and the moisture is 22%, then the dew point is 5° C. After the microchip 50 was mounted on each of the temperature control apparatuses 10, the humidity of the closed-space 14 was reduced to at most 22% so that the air confined in the closed-space 14 has a dew point of at most 5° C. The dew point of at most 5° C. is much lower than the temperatures of 20° C. and 10° C. at which the first and second Peltier-type temperature control units 20 and 30 were adjusted.

Currents were applied to the first and second Peltier-type temperature control units 20 and 30 and the heater-type temperature control unit 40 so that the first and second Peltier-type temperature control units 20 and 30 have the temperatures of 20° C. and 10° C., while the heater-type temperature control unit 40 has the temperature of 40° C.

The second Peltier-type temperature control unit 30 has the lowest temperature. For each of the temperature control apparatuses 10 shown in FIGS. 1, 7 and 8, the second Peltier-type temperature control unit 30 was observed to confirm whether moisture condensation was caused or not.

As a comparative example, a temperature control apparatus was prepared which is free of the frame. Thus, the temperature control apparatus of the comparative example has an open-space that is defined between the heat sink and the microchip. The first and second Peltier-type temperature control units 20 and 30 and the heater-type temperature control unit 40 are disposed in the open-space. In other words, the first and second Peltier-type temperature control units 20 and 30 and the heater-type temperature control unit 40 are exposed to the outside atmosphere.

The temperature control apparatus 10 of the first embodiment as shown in FIG. 1 was operated to fill the closed-space 14 with a dry nitrogen gas so as to reduce the humidity and obtain the dew pint of 5° C. 3 minutes were elapsed to reduce the humidity and obtain the dew pint of 5° C. The first and second Peltier-type temperature control units 20 and 30 and the heater-type temperature control unit 40 were operated to perform temperature controls of the first, second and third reactors 51, 52 and 53 of the microchip 50. The second Peltier-type temperature control unit 30 was observed. It was confirmed that no moisture condensation was caused on the exposed surface of the second Peltier-type temperature control unit 30. As described above, the second Peltier-type temperature control unit 30 has the lower temperature than those of the first Peltier-type temperature control unit 20 and the heater-type temperature control unit 40. This means that no moisture condensations will have been caused on the exposed surfaces of the first Peltier-type temperature control unit 20 and the heater-type temperature control unit 40 as long as no moisture condensation was caused on the exposed surface of the second Peltier-type temperature control unit 30.

The temperature control apparatus 10 of the second embodiment as shown in FIG. 7 was operated to depressurize the closed-space 14 prior to filling the closed-space 14 with a dry nitrogen gas. Filling the dry nitrogen gas in the closed-space 14 reduces the humidity and obtains the dew pint of 5° C. 1 minute was elapsed to reduce the humidity and obtain the dew pint of 5° C. The first and second Peltier-type temperature control units 20 and 30 and the heater-type temperature control unit 40 were operated to perform temperature controls of the first, second and third reactors 51, 52 and 53 of the microchip 50. The second Peltier-type temperature control unit 30 was observed. It was confirmed that no moisture condensation was caused on the exposed surface of the second Peltier-type temperature control unit 30. As described above, the second Peltier-type temperature control unit 30 has the lower temperature than those of the first Peltier-type temperature control unit 20 and the heater-type temperature control unit 40. This means that no moisture condensations will have been caused on the exposed surfaces of the first Peltier-type temperature control unit 20 and the heater-type temperature control unit 40 as long as no moisture condensation was caused on the exposed surface of the second Peltier-type temperature control unit 30.

The temperature control apparatus 10 of the third embodiment as shown in FIG. 8 was operated to fill the closed-space 14 with a dry air so as to reduce the humidity and obtain the dew pint of 5° C. 3 minutes were elapsed to reduce the humidity and obtain the dew pint of 5° C. The first and second Peltier-type temperature control units 20 and 30 and the heater-type temperature control unit 40 were operated to perform temperature controls of the first, second and third reactors 51, 52 and 53 of the microchip 50. The second Peltier-type temperature control unit 30 was observed. It was confirmed that no moisture condensation was caused on the exposed surface of the second Peltier-type temperature control unit 30. As described above, the second Peltier-type temperature control unit 30 has the lower temperature than those of the first Peltier-type temperature control unit 20 and the heater-type temperature control unit 40. This means that no moisture condensations will have been caused on the exposed surfaces of the first Peltier-type temperature control unit 20 and the heater-type temperature control unit 40 as long as no moisture condensation was caused on the exposed surface of the second Peltier-type temperature control unit 30.

The temperature control apparatus of the comparative example was operated. The first and second Peltier-type temperature control units 20 and 30 and the heater-type temperature control unit 40 were operated, while being exposed to the atmosphere, so as to perform temperature controls of the first, second and third reactors 51, 52 and 53 of the microchip 50. The second Peltier-type temperature control unit 30 was observed. It was confirmed that a moisture condensation was caused on the exposed surface of the second Peltier-type temperature control unit 30.

The above-described experiments demonstrated that the temperature control apparatuses 10 of the first, second and third embodiments are capable of preventing moisture condensations from appearing on the exposed surfaces of the first and second Peltier-type temperature control units 20 and 30.

The temperature control apparatus 10 of the second embodiment depressurized the closed-space 14 prior to quickly filling the closed-space 14 with the dry nitrogen gas. It was demonstrated that the dehumidifying process performed by the temperature control apparatus 10 of the second embodiment is faster than those of the other temperature control apparatuses 10 of the first and third embodiments.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The term "gas" means any types of gas including an air.

The meaning of the term "adjacent to" includes, but is not limited to, the term "adjacent closely to" and the term "in contact with".

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A temperature control apparatus comprising:
    a heat sink;
    a temperature control unit disposed adjacent to the heat sink, the temperature control unit including at least one Peltier-type temperature control device configured to control the temperature of at least a temperature controlled portion of a microchip; and
    a surrounding unit disposed on the heat sink, the surrounding unit being configured to surround the at least one Peltier-type temperature control device, the surrounding unit being configured to define a closed-space together with the heat sink and the microchip, the closed-space containing the at least one Peltier-type temperature control device.

2. The temperature control apparatus according to claim 1, wherein the surrounding unit comprises a frame that is attached to the heat sink.

3. The temperature control apparatus according to claim 2, wherein the surrounding unit further comprises a sealing member disposed between the frame and the microchip, the sealing member is configured to seal the closed-space, and the sealing member is flexible and heat-insulative.

4. The temperature control apparatus according to claim 1, wherein the surrounding unit comprises a frame that is attached to the microchip.

5. The temperature control apparatus according to claim 4, wherein the surrounding unit further comprises a sealing member disposed between the frame and the heat sink, the sealing member is configured to seal the closed-space, and the sealing member is flexible and heat-insulative.

6. The temperature control apparatus according to claim 1, further comprising:
    a filler disposed in the closed-space and between the at least one Peltier-type temperature control device and the surrounding unit.

7. The temperature control apparatus according to claim 1, further comprising:
    a dehumidifier configured to reduce a humidity of the closed-space.

8. The temperature control apparatus according to claim 7, wherein the dehumidifier is configured to supply a dehumidified gas to the closed-space.

9. The temperature control apparatus according to claim 7, wherein the dehumidifier is configured to depressurize the closed-space.

10. The temperature control apparatus according to claim 7, wherein the dehumidifier comprises:
    a gas circulation system including a gas circulation passage that extends to the outside of the closed-space and communicates with the closed-space, the gas circulation system being configured to circulate a gas in the closed-space through the gas circulation passage; and
    a first cooling unit disposed on the gas circulation passage, the first cooling unit being configured to cool the gas flowing through the gas circulation passage and to cause moisture condensation, thereby producing a dehumidified gas.

11. The temperature control apparatus according to claim 10, wherein the dehumidifier further comprises:
    a gas supplying unit disposed on the gas circulation passage downstream of the first cooling unit, the gas supplying unit being configured to contain the dehumidified gas and supply the dehumidified gas to the closed-space.

12. The temperature control apparatus according to claim 7, wherein the dehumidifier comprises:
    an endothermic reacting portion configured to be exposed to the closed-space; and
    a second cooling unit configured to cool the endothermic reacting portion at a lower temperature than that of the temperature control unit.

13. The temperature control apparatus according to claim 7, wherein the dehumidifier comprises:
    a gas circulation system including a gas circulation passage that extends to the outside of the closed-space and communicates with the closed-space, the gas circulation system being configured to circulate a gas in the closed-space through the gas circulation passage; and
    a moisture absorber disposed on the gas circulation passage, the moisture absorber being configured to absorb a moisture that is contained in the gas flowing through the gas circulation passage, thereby producing a dehumidified gas.

14. The temperature control apparatus according to claim 13, wherein the dehumidifier further comprises:
    a gas supplying unit disposed on the gas circulation passage downstream of the moisture absorber, the gas supplying unit being configured to contain the dehumidified gas and supply the dehumidified gas to the closed-space.

15. The temperature control apparatus according to claim 1, further comprising:
    a depressurizing unit configured to depressurize the closed-space.

16. The temperature control apparatus according to claim 1, further comprising:
    a cold dehumidifier disposed adjacent to the heat sink and in the closed-space, the cold dehumidifier being configured to be controlled to have a lower temperature than that of the temperature control unit.

17. The temperature control apparatus according to claim 16, wherein the cold dehumidifier is configured to be removable from the heat sink.

18. The temperature control apparatus according to claim 16, wherein the cold dehumidifier includes at least one different Peltier-type temperature control device than the at least one Peltier-type temperature control device included in the temperature control unit.

19. The temperature control apparatus according to claim 1, wherein the surrounding unit is configured to support the microchip and allow the microchip to be removably mounted on the temperature control apparatus.

20. The temperature control apparatus according to claim 7, wherein the dehumidifier is configured to reduce the humidity at a predetermined humidity level at which a dew point of a gas confined in the closed-space is lower than a lower limit of a controllable temperature range of the at least one Peltier-type temperature control device.

* * * * *